(12) United States Patent
Hashimoto et al.

(10) Patent No.: US 11,411,133 B2
(45) Date of Patent: Aug. 9, 2022

(54) METHOD OF MANUFACTURING LIGHT-EMITTING DEVICE, LIGHT-EMITTING DEVICE, AND LIGHT SOURCE DEVICE

(71) Applicant: NICHIA CORPORATION, Anan (JP)

(72) Inventors: Toru Hashimoto, Tokushima (JP);
Masato Aihara, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 165 days.

(21) Appl. No.: 16/683,956

(22) Filed: Nov. 14, 2019

(65) Prior Publication Data

US 2020/0161497 A1 May 21, 2020

(30) Foreign Application Priority Data

Nov. 15, 2018 (JP) .............................. JP2018-214945

(51) Int. Cl.
*H01L 21/00* (2006.01)
*H01L 33/00* (2010.01)
(Continued)

(52) U.S. Cl.
CPC ...... *H01L 33/0095* (2013.01); *H01L 25/0753* (2013.01); *H01L 33/60* (2013.01);
(Continued)

(58) Field of Classification Search
CPC . H01L 33/0095; H01L 33/60; H01L 25/0753; H01L 33/62; H01L 2933/0066; H01L 2933/0058; H01L 2224/16225; H01L 33/56; H01L 2933/005; H01L 33/58; H01L 27/156; H01L 33/10; H01L 33/50; H01L 33/005; H01L 33/36; H01L 33/44
See application file for complete search history.

(56) References Cited

U.S. PATENT DOCUMENTS

2015/0007042 A1 1/2015 Gay et al.
2015/0295152 A1 10/2015 Yoneda et al.
(Continued)

FOREIGN PATENT DOCUMENTS

JP 2012-124191 A 6/2012
JP 2015-135904 A 7/2015
(Continued)

*Primary Examiner* — Ismail A Muse
(74) *Attorney, Agent, or Firm* — Foley & Lardner LLP

(57) ABSTRACT

A method of manufacturing a light-emitting device includes: providing an intermediate structure including: layered bodies in a light-reflective member, a semiconductor layered body, and a light-transmissive member; forming at least one first groove at a first surface of the intermediate structure; forming at least one electrically conductive film, each disposed on the first surface and inside a respective one of the at least one first groove; exposing a portion of the light-reflective member in an inter-electrode region; forming a hole having a width equal to or greater than a width of the at least one first groove and having a depth equal to or greater than a depth of the at least one first groove; and cutting the light-reflective member and the at least one electrically conductive film along the at least one first groove to obtain a plurality of light-emitting devices.

5 Claims, 16 Drawing Sheets

(51) Int. Cl.
    *H01L 33/60*     (2010.01)
    *H01L 25/075*     (2006.01)
    *H01L 33/62*     (2010.01)

(52) U.S. Cl.
    CPC ...... *H01L 33/62* (2013.01); *H01L 2933/0058* (2013.01); *H01L 2933/0066* (2013.01)

(56) References Cited

U.S. PATENT DOCUMENTS

| | | |
|---|---|---|
| 2015/0380622 A1 | 12/2015 | Miyoshi et al. |
| 2017/0040512 A1 | 2/2017 | Tani et al. |
| 2017/0179344 A1 | 6/2017 | Matsuda |
| 2017/0294419 A1 | 10/2017 | Nakabayashi et al. |
| 2018/0090648 A1 | 3/2018 | Yuu |
| 2018/0159004 A1* | 6/2018 | Lai ........................ H01L 33/505 |
| 2018/0226385 A1 | 8/2018 | Nakabayashi et al. |
| 2018/0315897 A1 | 11/2018 | Nakabayashi et al. |

FOREIGN PATENT DOCUMENTS

| | | |
|---|---|---|
| JP | 2015-201605 A | 11/2015 |
| JP | 2016-027620 A | 2/2016 |
| JP | 2017-034145 A | 2/2017 |
| JP | 2017-118098 A | 6/2017 |
| JP | 2017-188589 A | 10/2017 |
| JP | 2018-061027 A | 4/2018 |
| JP | 2018-093197 A | 6/2018 |
| JP | 2018-129434 A | 8/2018 |
| JP | 2019-016766 A | 1/2019 |

\* cited by examiner

METHOD OF MANUFACTURING LIGHT-EMITTING DEVICE, LIGHT-EMITTING DEVICE, AND LIGHT SOURCE DEVICE

CROSS-REFERENCE TO RELATED APPLICATION

The present application claims priority to Japanese Patent Application No. 2018-214945, filed on Nov. 15, 2018, the contents of which are hereby incorporated by reference in their entirety.

BACKGROUND

The present disclosure relates to a method of manufacturing a light-emitting device, a light-emitting device, and a light source device.

Japanese Patent Publication No. 2012-124191 describes a side-view type light-emitting device. The light-emitting device in Japanese Patent Publication No. 2012-124191 includes a circuit board at a back-surface side of the light-emitting device, so that a length between the light emission surface and the back surface of the light-emitting device tends to be increased.

SUMMARY

An object of certain embodiments of the present invention is to provide a method of manufacturing a small light-emitting device, a small light-emitting device, and a light source device.

A method of manufacturing a light-emitting device according to one embodiment includes providing an intermediate structure, the intermediate structure including a plurality of layered bodies aligned in a first direction in a light-reflective member and having a first surface, each of the layered bodies including a pair of electrodes aligned in a second direction intersecting with the first direction, the pair of electrodes being exposed from the light-reflective member on the first surface, a semiconductor layered body connected to the pair of electrodes, and a light-transmissive member; forming at least one first groove on the first surface in the light-reflective member at a location between two adjacent layered bodies of the plurality of layered bodies; forming electrically conductive films such that each of the electrically conductive films is disposed on the first surface and inside a respective one of the at least one first groove; exposing a portion of the light-reflective member in an inter-electrode region between the pair of electrodes on the first surface by removing a corresponding portion of the electrically conductive film covering the inter-electrode region; forming a hole having a width equal to or greater than a width of the at least one first groove and having a depth equal to or greater than a depth of the at least one first groove, so as to remove a portion of each of the electrically conductive films inside a respective one of the at least one first groove at a location between two inter-electrode regions adjacent to each other across the respective one of the at least one first groove; and cutting the light-reflective member and the electrically conductive film along the at least one first groove to obtain a plurality of light-emitting devices.

A light-emitting device according to one embodiment includes a structure, a pair of first electrically conductive films, and a pair of second electrically conductive films. The structure includes a layered body including a light-emitting element including a pair of electrodes and a light-transmissive member disposed on the light-emitting element; and a light-reflective member covering lateral surfaces of the layered body. The structure has a first surface at which the pair of electrodes exposed from the light-reflective member; and a second surface connected to the first surface and constituted of the light-reflective member. The pair of first electrically conductive films disposed on the first surface of the structure such that each of the pair of first electrically conductive films is connected to a respective one of the pair of electrodes. The pair of second electrically conductive films disposed on the second surface of the structure, each of the pair of electrically conductive films being continuous with the pair of first electrically conductive films. A recess defined by an inner surface constituted of the light-reflective member is formed between the pair of second electrically conductive films on the second surface of the structure.

A light source device according to one embodiment includes the light-emitting device, a mounting board facing the second surface of the structure, and a bonding member bonding the second electrically conductive films to the mounting board. A first region of the second surface constituted of the light-reflective member at the pair of electrodes is recessed inward relative to a second region of the second surface at the light-transmissive member. The bonding member is disposed between the mounting board and the first region.

According to certain embodiments, a small light-emitting device, a small light source device, and a method of manufacturing a small light-emitting device can be obtained.

DETAILED DESCRIPTION

First Embodiment

Figure 1A:
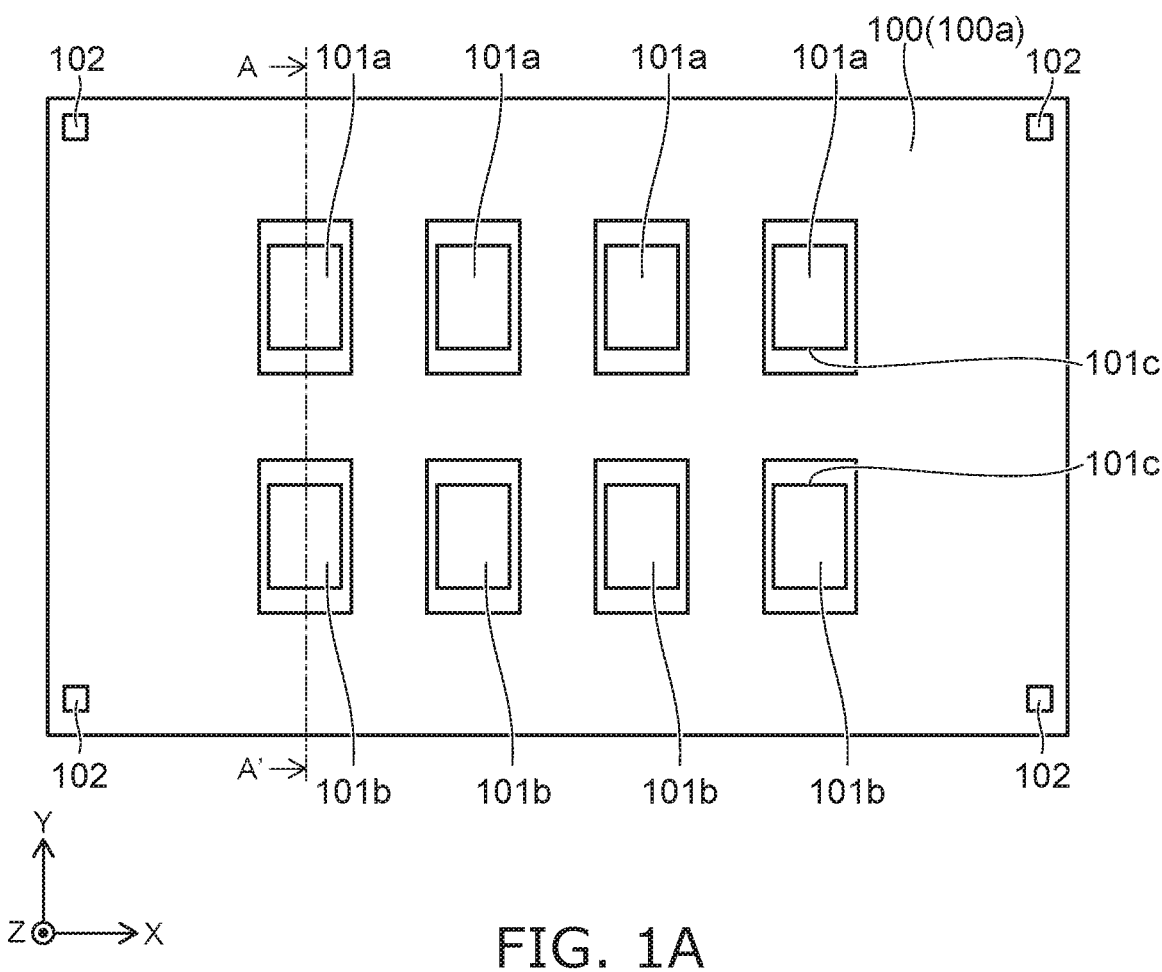
FIG. 1A is a schematic plan view for illustrating a method of manufacturing a light-emitting device according to a first embodiment.

A method of manufacturing a light-emitting device, the structure of the manufactured light-emitting device, and the structure of a light source device including the light-emitting device according to embodiments of the present invention will be described below.

Drawings referred to below are schematic, and illustration of some components in the drawings may be exaggerated or omitted as appropriate. Ratios between dimensions of components in the drawings are not necessarily the same. In the present disclosure, the term "perpendicular" indicates that an angle between two straight lines, sides, or planes is in the range of about 90°±3° unless otherwise stated. In the present disclosure, the term "parallel" indicates that an angle between two straight lines, sides, or planes is in the range of about 0°±3° unless otherwise stated.

The method of manufacturing a light-emitting device according to the present embodiment will be described. The method of manufacturing a light-emitting device according to the present embodiment includes providing an intermediate structure 23, forming first grooves 106, forming an electrically conductive film 25, exposing a light-reflective member 21 in inter-electrode regions 107 and 108, forming holes 109, and singulating into a plurality of light-emitting devices 1.

Figure 1B:
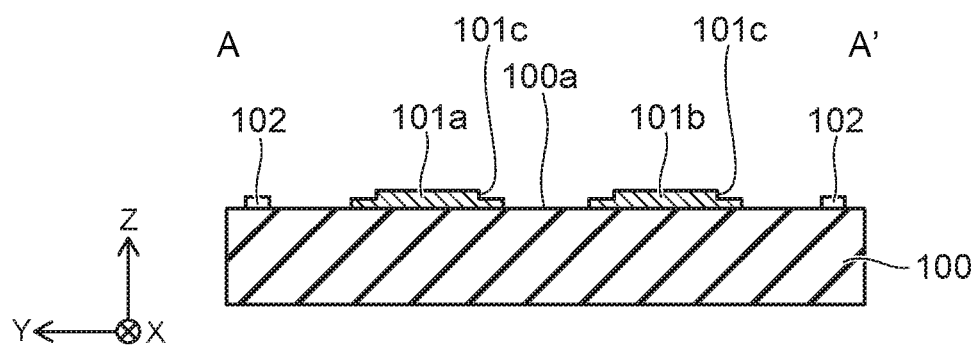
FIG. 1B is a schematic cross-sectional view taken along the line A-A' of FIG. 1A.

FIG. 1A to FIG. 12B illustrate the method of manufacturing a light-emitting device according to the present embodiment. FIG. 1A, FIG. 2A, and FIG. 3A to FIG. 12A are schematic plan views, and FIG. 1B, FIG. 2B, and FIG. 3B to FIG. 12B are schematic cross-sectional views, each corresponding to a respective one of the plan views in FIG. 1A, FIG. 2A, and FIG. 3A to FIG. 12A. FIG. 1B is a schematic cross-sectional view taken along the line A-A' of FIG. 1A and shows the same step as shown in FIG. 1A. The same applies to FIG. 2B to FIG. 4B. FIG. 5B is a schematic cross-sectional view taken along the line B-B' of FIG. 5A and shows the same step as shown in FIG. 5A. The same applies to FIG. 6B and FIG. 7B. FIG. 8B is a schematic cross-sectional view taken along the line C-C' of FIG. 8A and shows the same step as shown in FIG. 8A. The same applies to FIG. 9B to FIG. 12B.

Providing Intermediate Structure 23

The intermediate structure 23, in which a plurality of layered bodies 20 are arranged in a first direction inside the light-reflective member 21, is provided. The layered bodies 20 each include a plurality of electrodes 12a and 12b arranged in a second direction intersecting with the first direction, a semiconductor layered body 11 connected to the plurality of electrodes 12a and 12b, and a light-transmissive member 16. The intermediate structure 23 has a first surface 23a at which the plurality of electrodes 12a and 12b will be exposed from the light-reflective member 21. The intermediate structure 23 may be provided through one example of manufacturing steps described below or by purchasing an intermediate structure 23 that has already been manufactured.

An example of a case in which the intermediate structure 23 is provided by manufacturing is described below.

A substrate 100 is provided as shown in FIG. 1A and FIG. 1B. For example, the substrate 100 includes an insulating base as a base member and has an upper surface 100a on which first metal layer portions 101a and second metal layer portions 101b are disposed. The first metal layer portions 101a and the second metal layer portions 101b are disposed such that each of the first metal layer portions 101a is adjacent to a respective one of the second metal layer portions 101b, as a pair of metal layer portions 101a and 101b, and a plurality of pairs of metal layer portions 101a and 10b are arranged, for example, in a matrix.

In the present specification, an XYZ orthogonal coordinate system is employed for ease of description. In the present specification, a direction in which the first metal layer portions 101a are aligned, and a direction in which the second metal layer portions 101b are aligned, are referred to as an "X direction" (first direction), a direction in which each pair of the first metal layer portion 101a and the second metal layer portion 101b are aligned is referred to as a "Y direction" (second direction), and a direction perpendicular to the X direction and the Y direction, in other words, a direction perpendicular to the upper surface 100a, is referred to as a "Z direction" (third direction).

Each metal layer portion 101a and each metal layer portion 101b may respectively have a projection 101c at respective upper surfaces of each metal layer portion 101a and each metal layer portion 101b as shown in FIG. 1B. Each projection 101c is located in a region that faces a respective electrode of a light-emitting element 10 described below. It is preferable that the shape of the upper surface of the projection 101c in a plan view be substantially the same as the shape of the electrode of the corresponding light-emitting element 10 in a plan view. This structure allows for effectively causing self-alignment of the light-emitting element 10 when the light-emitting element 10 is disposed on each pair of projections 101c via bonding members 103, so that mounting precision of the light-emitting element 10 can be improved. For example, the projection 101c and the electrode of the light-emitting element 10 may have rectangular shapes having substantially the same lengths (having deviation of ±5% or less, preferably ±3% or less) of the corresponding sides, in a plan view. In the present embodiment, an example in which four pairs of the first metal layer portions 101a and second metal layer portions 101b are disposed on the substrate 100 is shown to simplify the drawings, but any appropriate number of pairs of the first metal layer portions 101a and second metal layer portions 101b may be disposed. For example, five or more pairs of the first metal layer portions 101a and second metal layer portions 101b may be disposed.

As described below, the substrate 100 is removed when the light-emitting device 1 is provided. The maximum thickness of the substrate 100 is, for example, in a range of 100 μm to 500 μm, preferably 200 μm to 300 μm. This structure allows for facilitating removal of the substrate 100 while maintaining the strength of the substrate 100. For example, a glass fiber reinforced resin can be used as the base member of the substrate 100. For the glass fiber reinforced resin, for example, a Bismaleimide-Triazine (BT) resin having a thermal expansion coefficient of 3 ppm/° C. to 10 ppm/° C. is preferably used. This structure allows bonding members having a high melting point such as an AuSn alloy to be used for the bonding members 103. The glass fiber reinforced resin may be FR4 having a thermal expansion coefficient of 14 ppm/° C. to 15 ppm/° C. When using such a material, using solder or the like having a low melting point as the bonding members 103 allows for improving the reliability of the substrate 100. The content of the glass fiber in the base material is, for example, in a range of 30 wt % to 70 wt %, preferably 40 wt % to 60 wt %. With such a content, removal of the substrate 100 can be easily performed.

For the base material of the first metal layer portions 101a and the second metal layer portions 101b, for example, copper or a copper alloy can be used. The first metal layer portion 101a and the second metal layer portion 101b may include a phosphorus-containing nickel plating layer, a palladium plating layer, a first gold plating layer, and a second gold plating layer, in order on the copper or copper-alloy base member. The plating layer, described above, on the base material containing copper or a copper alloy allows for reducing diffusion of copper or the copper component contained in the copper alloy and corrosion, such as oxidation and sulfurization, of the surface of the first metal layer portions 101a and other components. Accordingly, deterioration of the substrate 100 can be inhibited, even in the case in which, for example, the substrate 100 is kept in storage for a long period.

The substrate 100 preferably includes recognition targets 102 on the upper surface 100a. The recognition targets 102 are marks used to recognize positional relationship with the first metal layer portions 101a and the second metal layer portions 101b viewed from above the upper surface 100a. The recognition targets 102 are, for example, marks made of an electrically-conductive material. Each of the recognition targets 102 can have a projecting shape, a recessed shape, or a combination of a projecting shape and a recessed shape. Positions and number of the recognition targets 102 can be appropriately selected, and the recognition targets 102 are located at positions not covered with the light-reflective member 21 in a step performed later.

The recognition targets 102 can be formed at the same time as the first metal layer portions 101a and the second metal layer portions 101b. Forming the recognition targets 102 at the same time as the first metal layer portions 101a and the second metal layer portions 101b allows for improving the accuracy of position in a step of mounting elements using the recognition targets 102 as the marks described later. For example, the recognition targets 102 can sequentially include a phosphorus-containing nickel plating layer, a palladium plating layer, a first gold plating layer, and a second gold plating layer on a copper or copper-alloy base member.

Figure 2A:
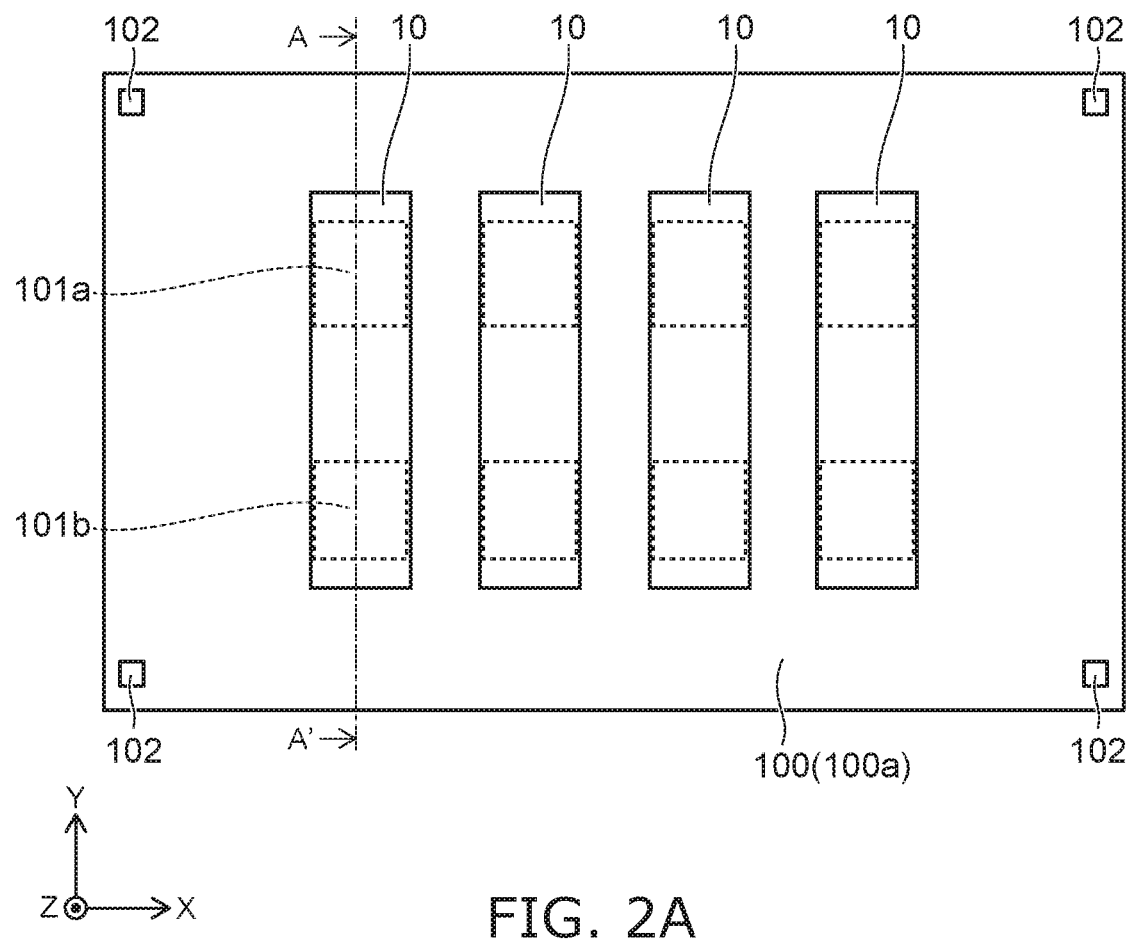
FIG. 2A is a schematic plan view for illustrating the method of manufacturing a light-emitting device according to the first embodiment.
Figure 2B:
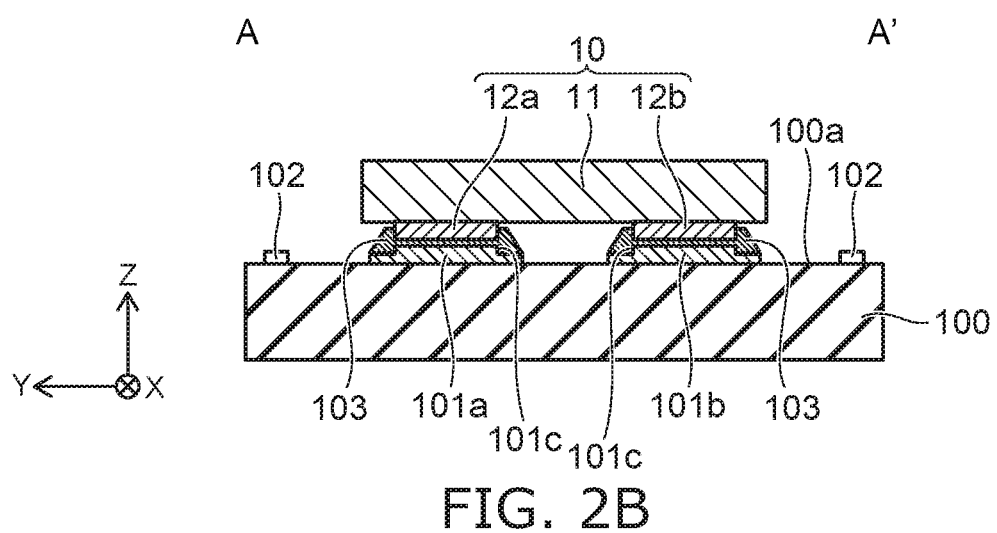
FIG. 2B is a schematic cross-sectional view taken along the line A-A' of FIG. 2A.

Subsequently, the bonding members 103 are disposed on the first metal layer portions 101a and on the second metal layer portions 101b as shown in FIG. 2A and FIG. 2B. Examples of the bonding members 103 include a solder. In the case in which each first metal layer portion 101a and each second metal layer portions 101b respectively have the projections 101c, each of the bonding members 103 is disposed on a respective one of the projections 101c. The light-emitting elements 10 are mounted on or above the substrate 100 with reference to the recognition targets 102. The light-emitting elements 10 are, for example, light-emitting diodes (LEDs). Each of the light-emitting elements 10 includes the semiconductor layered body 11 and the pair of electrodes 12a and 12b. Each light-emitting element 10 is mounted such that the lower surface of each electrode of each pair of electrodes 12a and 12b faces the upper surface of a respective metal layer portion of the first metal layer portions 101a and the second metal layer portions 101b of the substrate 100. Each light-emitting element 10 may include a growth substrate on a surface of the semiconductor layered body 11 opposite to the surface of the semiconductor layered body 11 connected to the pair of electrodes 12a and 12b. In each semiconductor layered body 11, an n-layer, a light-emitting layer, and a p-layer are layered. One of the n-layer and the p-layer is connected to a respective one of the electrodes 12a, and the other one is connected to the electrode 12b. The electrodes 12a and 12b are made of a metal material such as copper (Cu). When the light-emitting element 10 is mounted on or above the substrate 100, the electrode 12a of the light-emitting element 10 is connected to the first metal layer portion 101a via a bonding member 103, and the electrode 12b is connected to the second metal layer portion 101b via a bonding member 103.

Figure 3A:
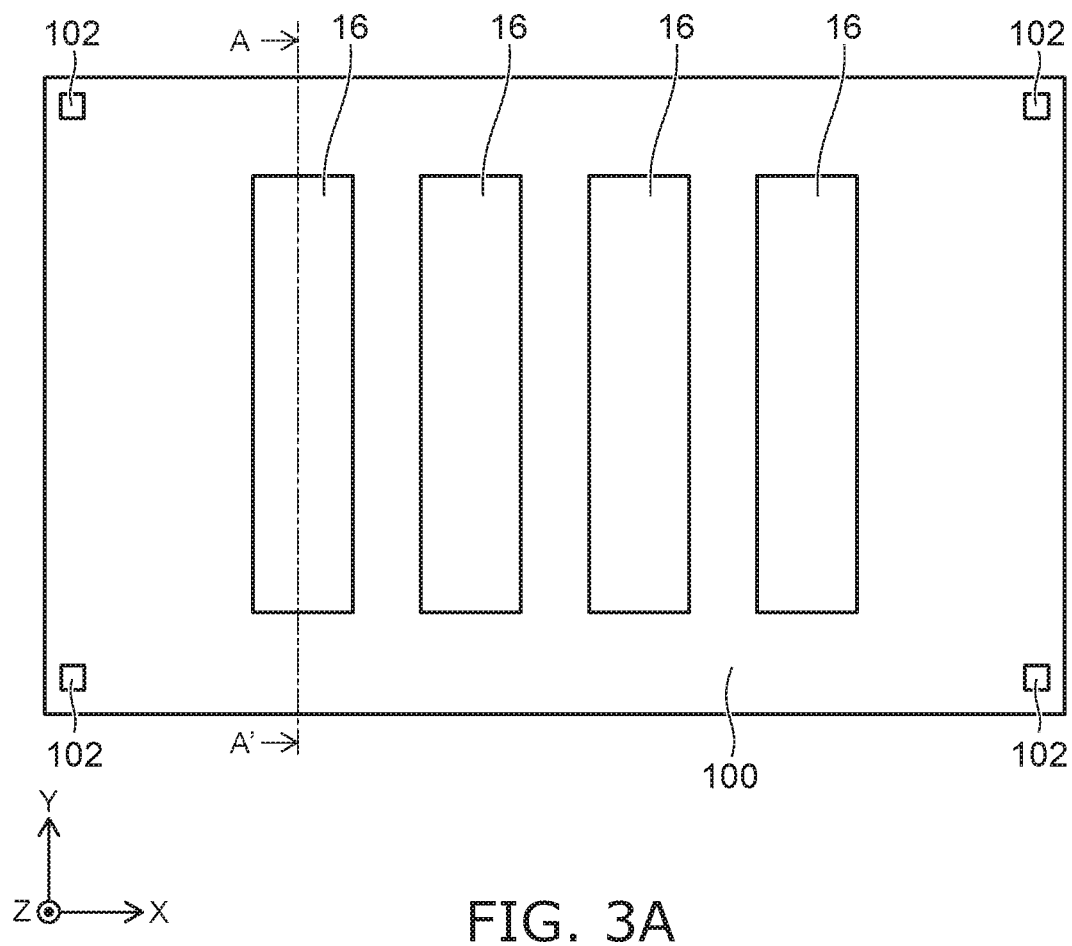
FIG. 3A is a schematic plan view for illustrating the method of manufacturing a light-emitting device according to the first embodiment.
Figure 3B:
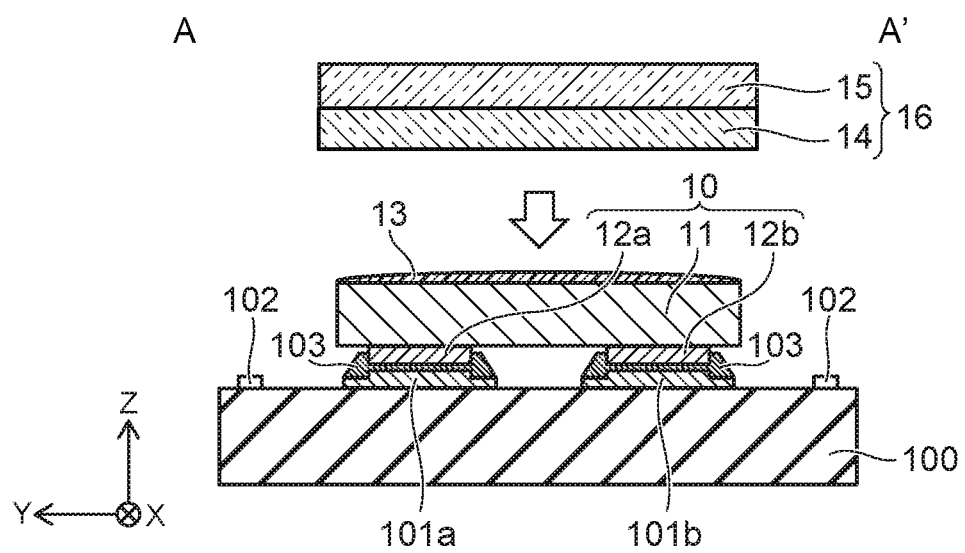
FIG. 3B is a schematic cross-sectional view taken along the line A-A' of FIG. 3A.

Subsequently, the light-transmissive member 16 is provided as shown in FIG. 3A and FIG. 3B. The light-transmissive member 16 preferably has a layered structure in which a phosphor layer 14 and a light-transmissive layer 15 are layered, as shown in FIG. 3A and FIG. 3B. The phosphor layer 14 contains a phosphor, and the light-transmissive layer 15 contains substantially no phosphor. The expression "contains substantially no phosphor" encompasses a case in which a phosphor is unavoidably mixed in the light-transmissive layer 15. The light-transmissive member 16 may include only the phosphor layer 14 or only the light-transmissive layer 15. The phosphor layer 14 and/or the light-transmissive layer 15 may be a single layer or may have a layered structure. In the case in which the phosphor layer 14 includes a plurality of layers, the phosphor layer 14 can include a layer containing a green phosphor that absorbs light emitted from the light-emitting element 10 to emit green light, and a layer containing a red phosphor that absorbs light emitted from the light-emitting element 10 to emit red light. Alternatively, for example, the phosphor layer 14 may be a single layer containing a green phosphor and a red phosphor.

Subsequently, an adhesive layer 13 is disposed on the upper surface of each light-emitting element 10, and the light-emitting element 10 and the light-transmissive member 16 are bonded together. In the case in which each light-transmissive member 16 includes the phosphor layer 14 and the light-transmissive layer 15, the light-transmissive member 16 is bonded to the upper surface of a respective one of the light-emitting elements 10 such that the phosphor layer 14 is brought into contact with the adhesive layer 13. The adhesive layer 13 to which the light-transmissive member 16 has been bonded (hereinafter referred to as a light guide member 13) preferably covers lateral surfaces of the light-emitting element 10, in addition to the upper surface of the light-emitting element 10. This structure allows for increasing the adhesive strength between the light-transmissive member 16 and the light-emitting element 10. The light guide member 13 preferably covers the light-emitting layer of the light-emitting element 10. This structure allows for reducing attenuation, inside the light-emitting element 10, of a portion of light that has reached a lateral surface of the light-emitting element 10 due to reflection by the lateral surface, so that the light can be extracted from the light-emitting element 10 to the outside through the light guide member 13.

The adhesive layer 13 and the light guide member 13 preferably have a high light transmittance. Accordingly, it is generally preferable that the adhesive layer 13 and the light guide member 13 contain substantially no additive that reflects, absorbs, or scatters light. The expression "contains substantially no additive" encompasses a case in which an additive is unavoidably mixed in the light guide member 13. The adhesive layer 13 and the light guide member 13 may contain light-diffusing particles and/or a phosphor.

Figure 4A:
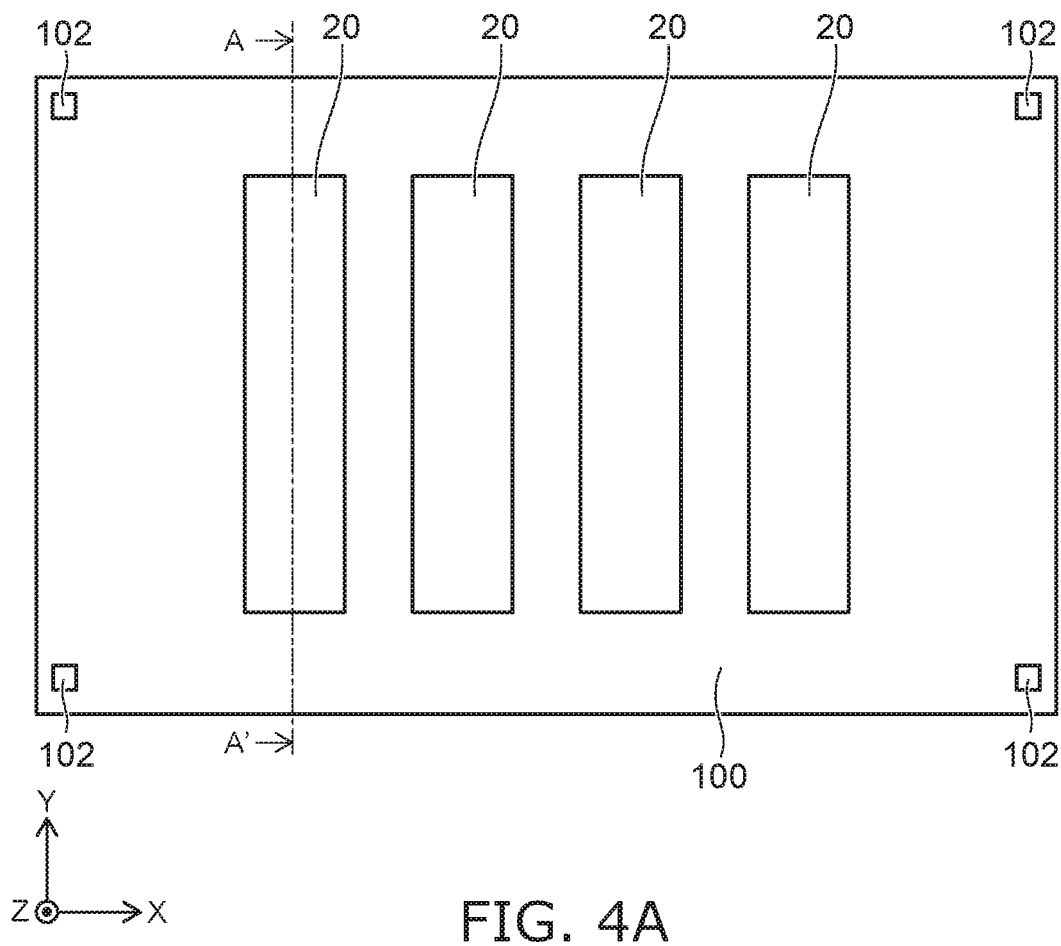
FIG. 4A is a schematic plan view for illustrating the method of manufacturing a light-emitting device according to the first embodiment.
Figure 4B:
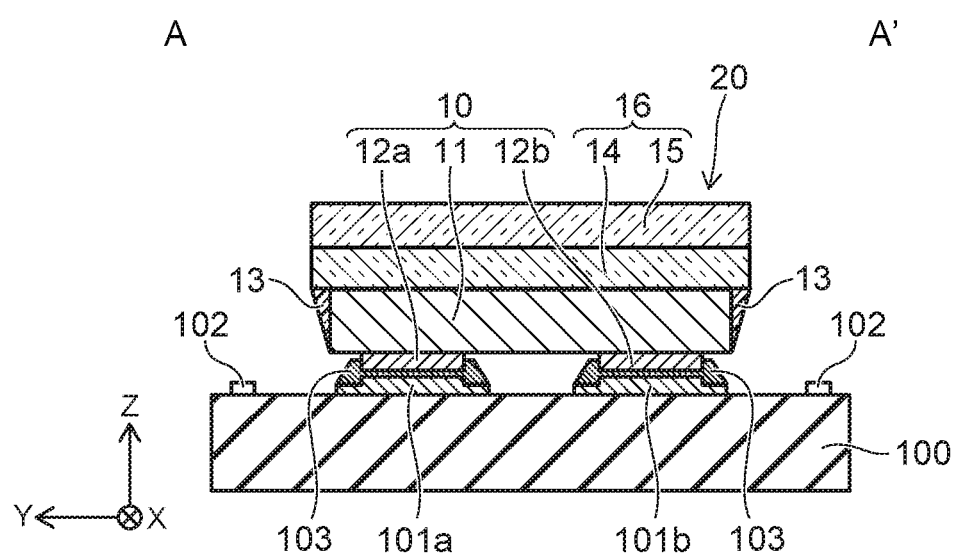
FIG. 4B is a schematic cross-sectional view taken along the line A-A' of FIG. 4A.
Figure 5A:
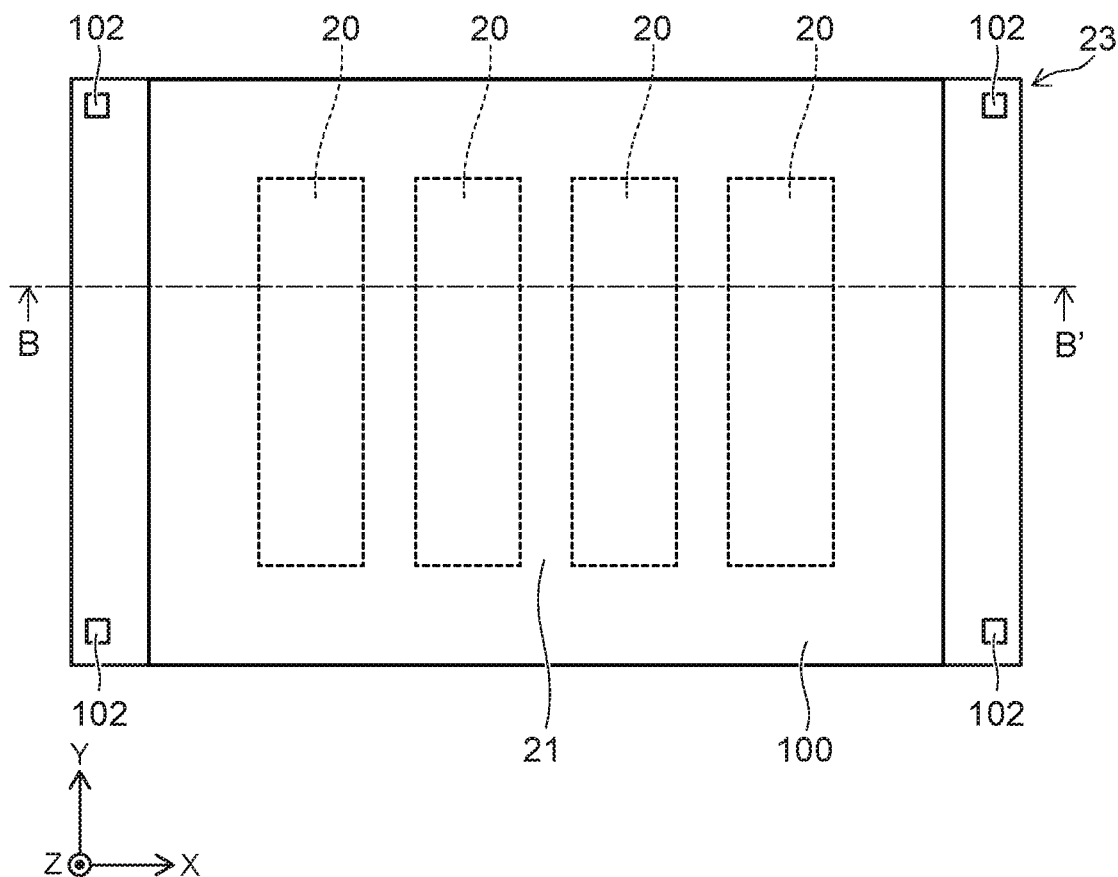
FIG. 5A is a schematic plan view for illustrating the method of manufacturing a light-emitting device according to the first embodiment.
Figure 5B:
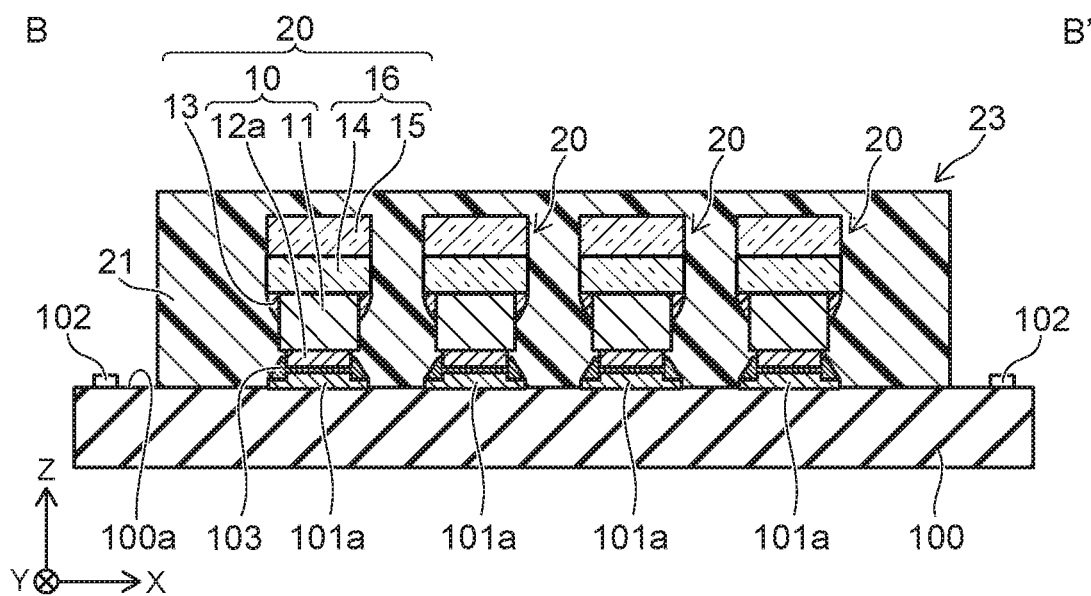
FIG. 5B is a schematic cross-sectional view taken along the line B-B' of FIG. 5A.

As described above, a plurality of layered bodies 20 each including a respective pair of electrodes 12a and 12b aligned in the second direction (Y direction), the semiconductor layered body 11 connected to the respective pair of electrodes 12a and 12b, and the light-transmissive member 16 disposed on the semiconductor layered body 11 are formed on the substrate 100 as shown in FIG. 4A and FIG. 4B.

Subsequently, the light-reflective member 21 is formed on the substrate 100 as shown in FIG. 5A and FIG. 5B. The light-reflective member 21 covers the first metal layer portions 101a and 101b, the bonding members 103, and the layered bodies 20. The light-reflective member 21 can be formed by, for example, disposing in a mold the substrate 100 on or above which the layered bodies 20 have been formed, injecting a resin material that will become the light-reflective member 21 into the mold, and solidifying the resin material. The light-reflective member 21 is preferably formed not covering the recognition targets 102. This structure allows second grooves 105 to be precisely formed with reference to the recognition targets 102 in a step of forming second grooves 105 described below. The light-reflective member 21 is made of, for example, a white resin. Accordingly, the intermediate structure 23 containing the light-reflective member 21 and the layered bodies 20 is thus formed on the substrate 100. In the intermediate structure 23, the layered bodies 20 are aligned in the first direction (X direction) inside the light-reflective member 21.

Figure 6A:
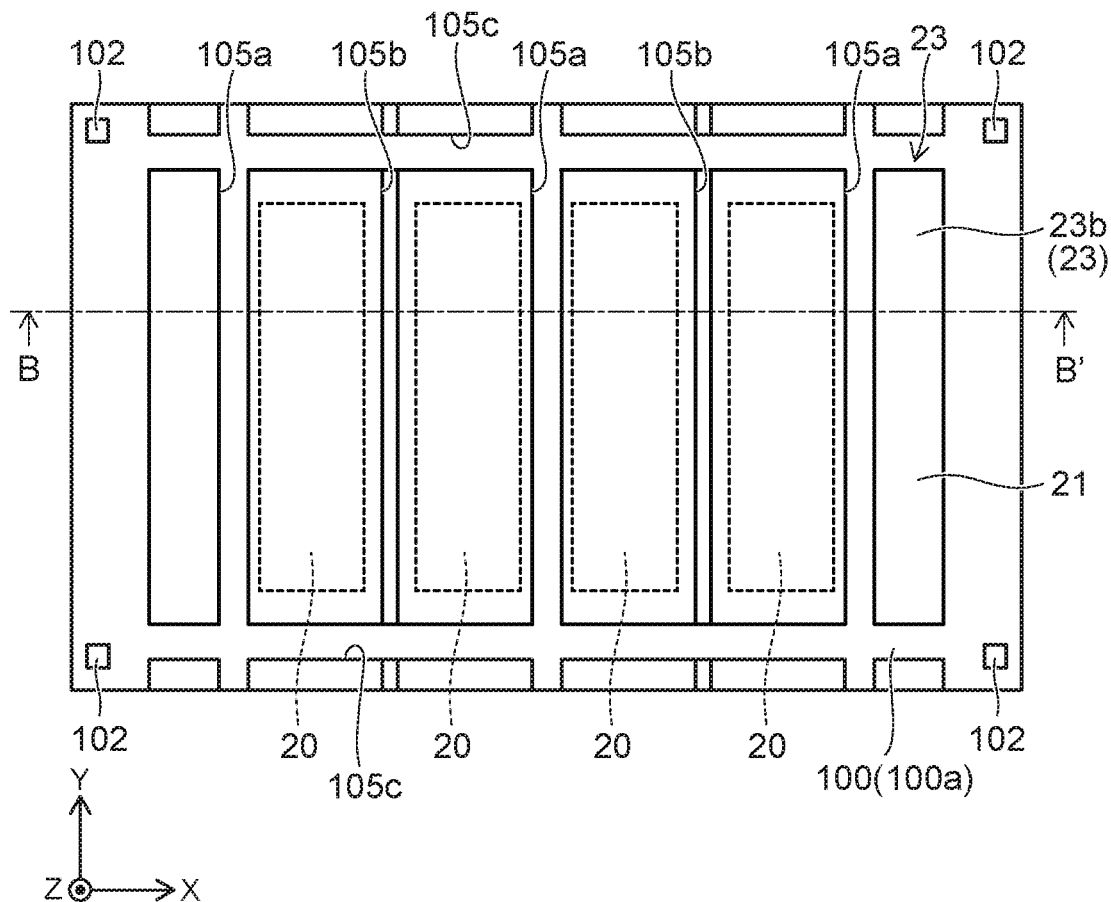
FIG. 6A is a schematic plan view for illustrating the method of manufacturing a light-emitting device according to the first embodiment.
Figure 6B:
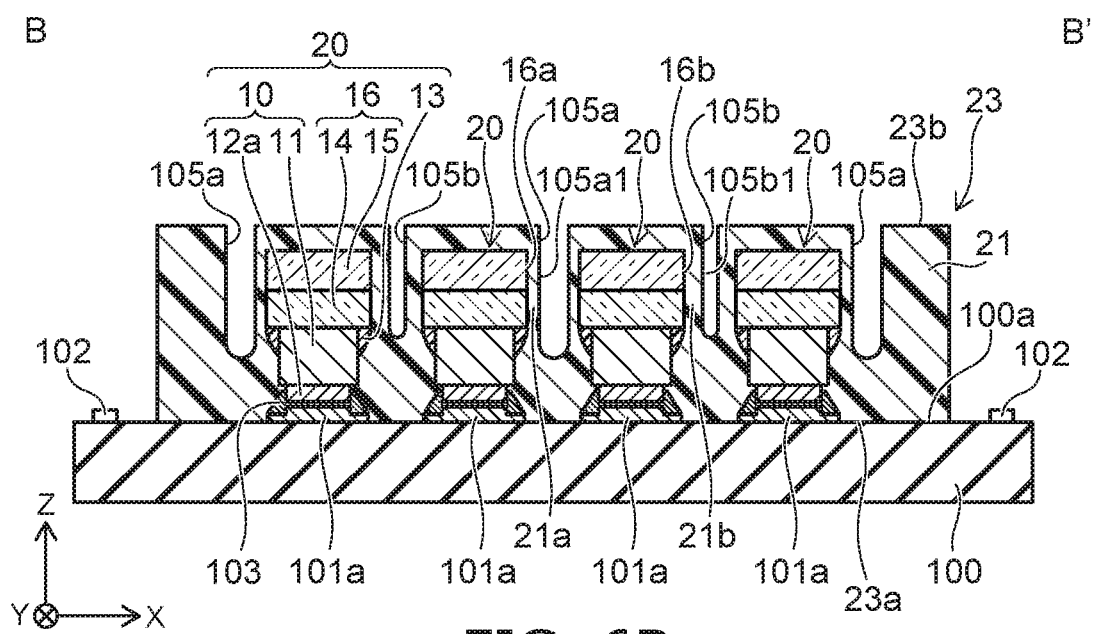
FIG. 6B is a schematic cross-sectional view taken along the line B-B' of FIG. 6A.

As used herein, a lower surface of the intermediate structure 23 in FIG. 6A and FIG. 6B is referred to as the "first surface 23a," and an upper surface of the intermediate structure 23 in FIG. 6A and FIG. 6B is referred to as a "second surface 23b." The first surface 23a of the intermediate structure 23 is opposite to the second surface 23b and faces the upper surface 100a of the substrate 100. Grooves 105a and 105b extending in the second direction (Y direction) and grooves 105c extending in the first direction (X direction) are preferably formed on the second surface 23b of the intermediate structure 23 with reference to the recognition targets 102 as shown in FIG. 6A and FIG. 6B. In other words, it is preferable that the light emission surface of each of the light-emitting devices 1 to be obtained be shaped with reference to the recognition targets 102. This allows for precisely shaping the light emission surfaces of the light-emitting devices 1.

In FIG. 6A, the grooves 105a and the grooves 105b are alternately arranged in the first direction (X direction). The grooves 105a are wider and deeper than the grooves 105b. The grooves 105a and 105b are collectively referred to as the "second grooves 105." Each second groove 105 is formed in a respective one of the gaps between corresponding ones of the layered bodies 20 in the light-reflective member 21. The second grooves 105 preferably do not penetrate through the intermediate structures 23 in the third direction (Z direction). This structure allows for reducing decrease in strength of the intermediate structure 23 to facilitate the carrying out of subsequent steps. The grooves 105c have the same width and the same depth, for example, as the grooves 105a. The grooves 105a, the grooves 105b, and the grooves 105c can be formed by dicing or by using a laser. The grooves 105a and the grooves 105b may have the same width and the same depth. Such grooves 105a, 105b, and 105c can be formed using, for example, one type of blade.

A preferable configuration of the widths and depths of the grooves 105a, 105b, and 105c will be described below.

The width of the grooves 105a on the second surface 23b of the intermediate structure 23 is, for example, in a range of 0.2 times to 0.9 times, preferably 0.3 times to 0.75 times, the distance between adjacent layered bodies 20 in the first direction (X direction). The width of the grooves 105a on the second surface 23b of the intermediate structure 23 is in a range of 25 μm to 200 μm, preferably 50 μm to 100 μm.

The width of the grooves 105b on the second surface 23b of the intermediate structure 23 is, for example, in a range of 0.15 times to 0.5 times, preferably 0.2 times to 0.35 times, the distance between adjacent layered bodies 20 in the first direction (X direction). The width of the grooves 105b on the second surface 23b of the intermediate structure 23 is in a range of 25 μm to 150 μm, preferably 40 μm to 80 μm.

The width of the grooves 105c on the second surface 23b of the intermediate structure 23 is, for example, in a range of 0.25 times to 0.65 times, preferably 0.3 times to 0.55 times, the distance between adjacent layered bodies 20 in the second direction (Y direction). The width of the grooves 105c is in a range of 25 μm to 200 μm, preferably 50 μm to 100 m.

The bottom surfaces of the grooves 105a and the bottom surfaces of the grooves 105b are preferably located at a position lower than the upper surfaces of the light-emitting elements 10 in the third direction (Z direction). With this arrangement, portions 21a of the light-reflective member 21, each located between a corresponding lateral surface 105a1 of a corresponding groove 105a and a corresponding lateral surface 16a of a light-transmissive member 16, and portions 21b of the light-reflective member 21, each located between a corresponding lateral surface 105b1 of a corresponding groove 105b and a corresponding lateral surface 16b of a light-transmissive member 16 can have desired thicknesses in the first direction (X direction). Accordingly, for example, each of the portions 21a and 21b of the light-reflective member 21 can have such a thickness that allows for reducing leakage, through the portions 21a and 21b to the outside, of light emitted from the lateral surfaces 16a and 16b of the light-transmissive members 16. Accordingly, the light-emitting devices 1 with high light extraction efficiency from light extraction surfaces 30a can be obtained. The thicknesses of the portions 21a and 21b of the light-reflective member 21 are preferably, for example, in a range of 15 μm to 50 μm and 20 μm to 30 μm, respectively. The thicknesses of the portions 21a and the portions 21b are preferably, for example, 3/40 to 1/4 and 1/10 to 3/20 of the thickness of the light-emitting elements 10 in the first direction (X direction), respectively.

The bottom surfaces of the grooves 105b are preferably located above the bottom surfaces of the grooves 105a in the third direction (Z direction). In the step of forming first grooves 106 described below, it is preferable that the first grooves 106 do not communicate with the grooves 105b while the first grooves 106 face the grooves 105b. In this case, if the bottom surfaces of the grooves 105b are located at a position higher than the bottom surfaces of the grooves 105a, depth of the first grooves 106 in the third direction (Z direction) can be increased. Accordingly, a larger region in which the electrically conductive film 25 is to be formed inside each first groove 106 can be ensured. Thus, the area of the electrically conductive film 25 located on the mounting surface of an obtained light-emitting device 1 can be increased, which allows for improving the bonding strength between the light-emitting device 1 and a mounting board 51 when the light-emitting device 1 is mounted on the mounting board 51 via bonding members 52. Also, with the bottom surface of the groove 105a located below the bottom surface of the groove 105b, a length of the light-reflective member 21 between the lateral surface 105a1, defined by the groove 105a, and a corresponding lateral surface of the layered body 20 can be a desired thickness over a wide area. Accordingly, for example, the light-reflective member 21 in this area can have such a thickness that allows for reducing leakage of light emitted from a corresponding lateral surface of the layered body 20 to the outside through the light-reflective member 21. In the case in which the bottom surface of a groove is a curved surface, the entire curved surface is regarded as the bottom surface of the groove.

Figure 7A:
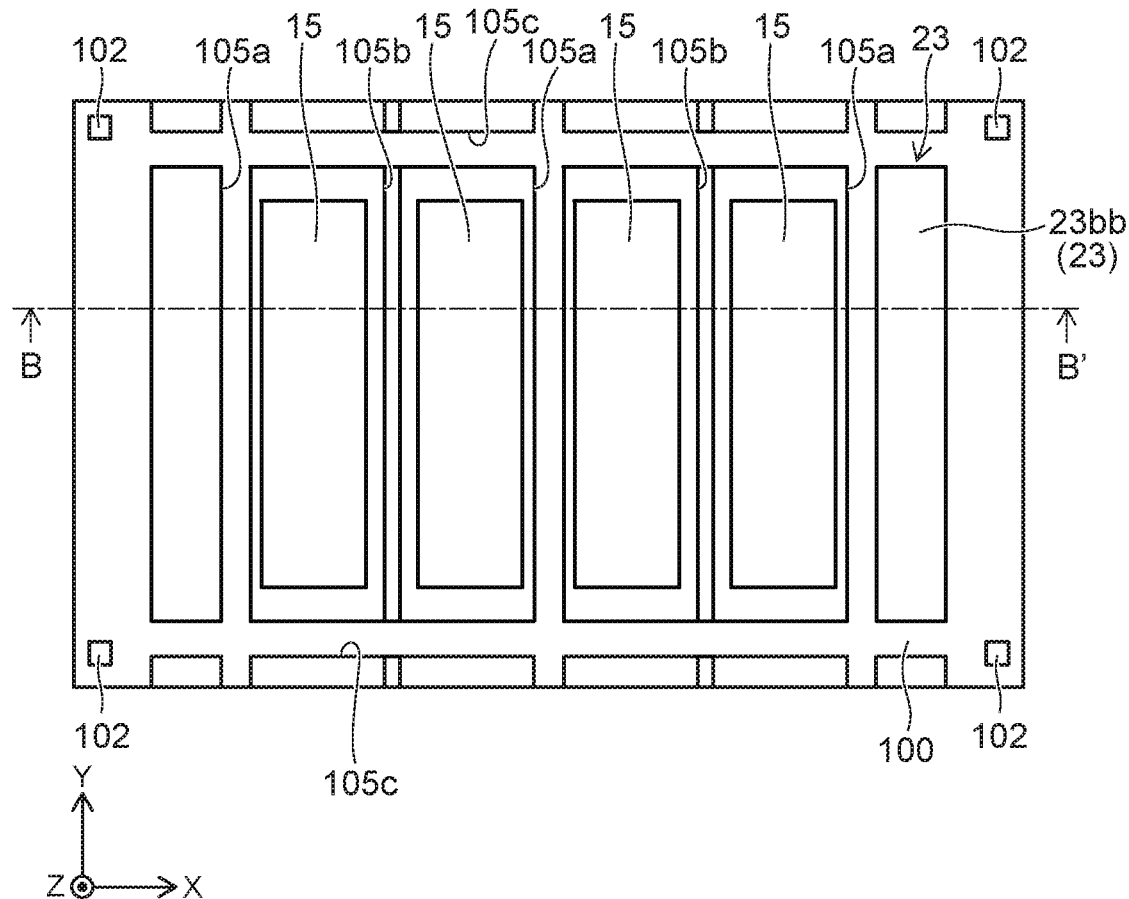
FIG. 7A is a schematic plan view for illustrating the method of manufacturing a light-emitting device according to the first embodiment.
Figure 7B:
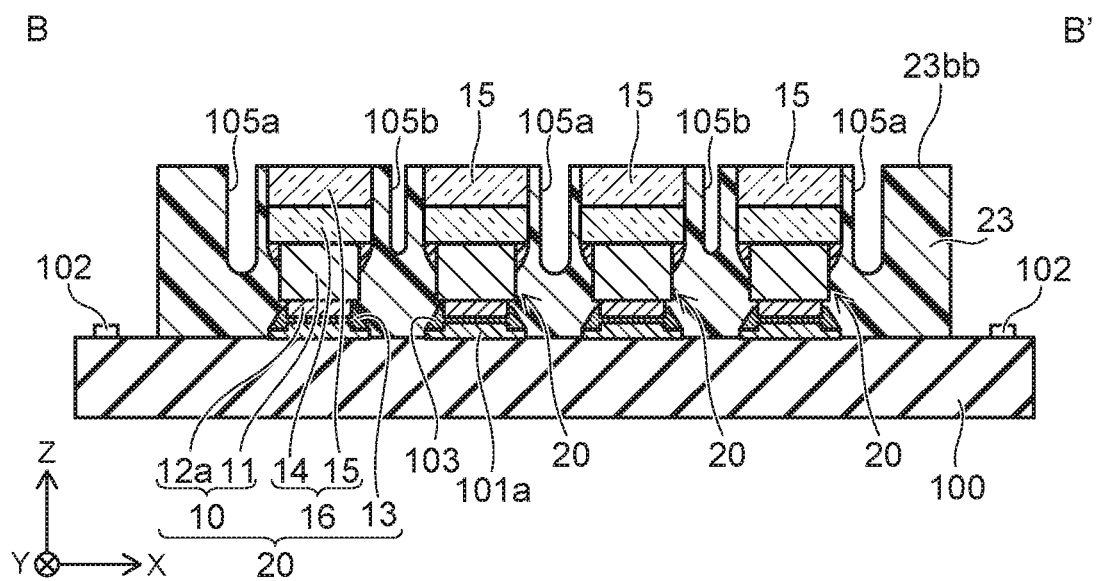
FIG. 7B is a schematic cross-sectional view taken along the line B-B' of FIG. 7A.
Figure 8A:
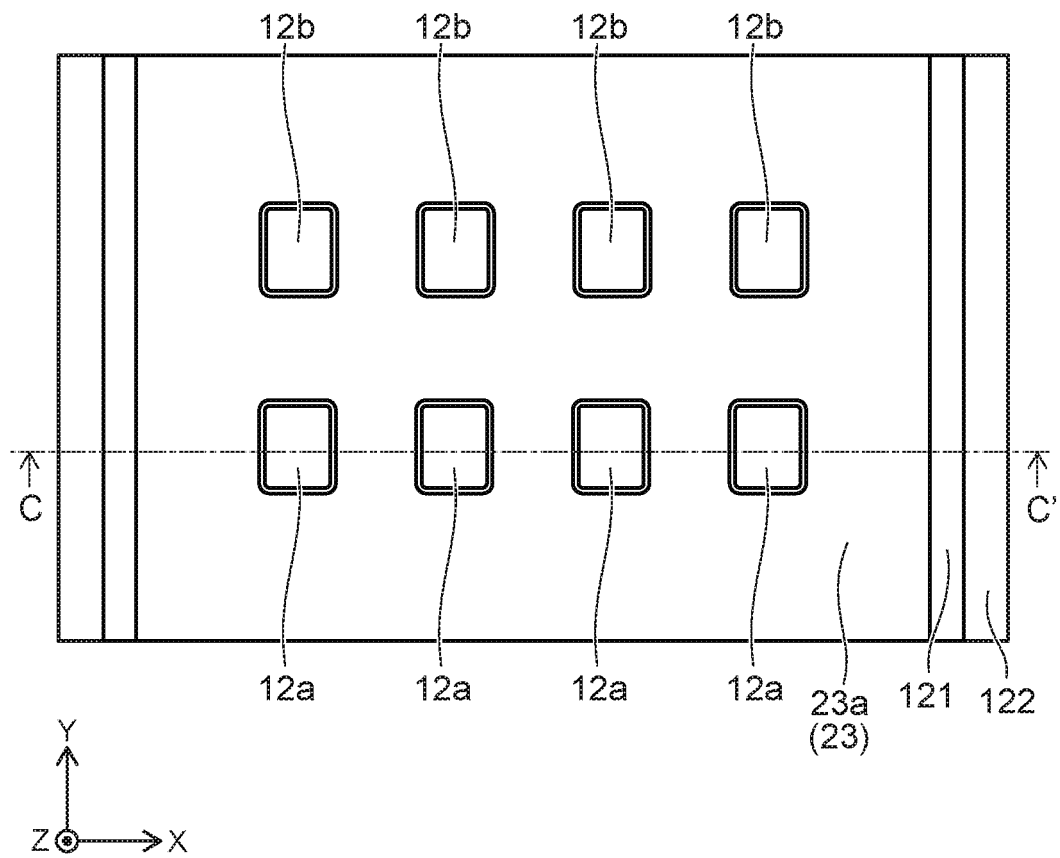
FIG. 8A is a schematic plan view for illustrating the method of manufacturing a light-emitting device according to the first embodiment.
Figure 8B:
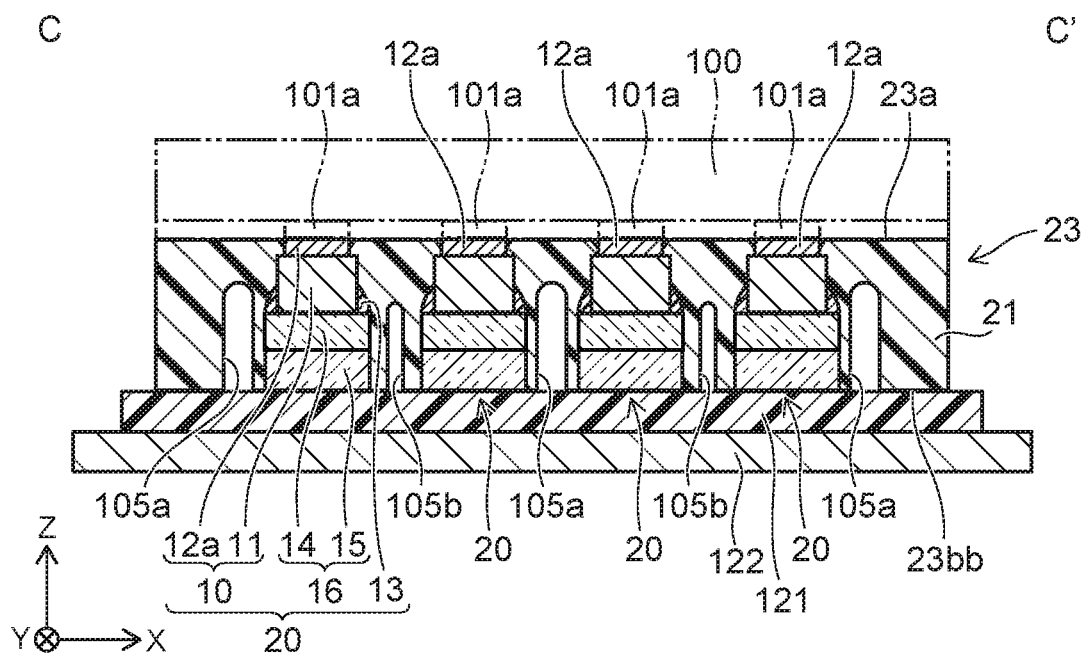
FIG. 8B is a schematic cross-sectional view taken along the line C-C' of FIG. 8A.

Subsequently, a portion of the light-reflective member 21 located at the second surface 23b of the intermediate structure 23 is removed as shown in FIG. 7A and FIG. 7B, creating a new second surface 23bb. The light-transmissive layer 15 of each light-transmissive member 16 is thus exposed on the new second surface 23bb. In a step of removing the light-reflective member 21, a portion of the light-transmissive layer 15 of the light-transmissive member 16 located below the portion of the light-reflective member 21 located at the second surface 23b may be removed in addition to the light-reflective member 21 constituting the second surface 23b. If the light-transmissive layer 15 is located above the phosphor layer 14, the possibility that the phosphor layer 14 is unintentionally removed in the step of removing the light-reflective member 21 can be reduced. The light-reflective member 21 can be removed by using a known method such as grinding, etching, cutting, and blasting. The step of removing the second surface 23b of the intermediate structure 23 can be performed before the step of forming the second grooves 105 and the grooves 105c.

Subsequently, the new second surface 23bb of the intermediate structure 23 is secured to a carrier 122 via an adhesive sheet 121 as shown in FIG. 8A and FIG. 8B. The carrier 122 is, for example, a silicon wafer or a metal substrate. In the description below, a direction indicated by the terms "upper," "higher," and the like, and a direction indicated by the term "lower" and the like in corresponding drawings are inverted from those in the description above and corresponding drawings. That is, while the direction from the semiconductor layered body 11 toward the light-transmissive member 16 is referred to as an upward direction in FIG. 1A to FIG. 7B and description with reference to FIG. 1A to FIG. 7B, the direction from the light-transmissive member 16 toward the semiconductor layered body 11 is referred to as an upward direction in FIG. 8A to FIG. 12B and description with reference to FIG. 8A to FIG. 12B. On the other hand, "upper surface" and "lower surface" of components in the description below with reference to FIG. 8A to FIG. 12B refer to the "upper surface" and "lower surface," respectively, of the same components in the description above with reference to FIG. 1A to FIG. 7B.

Subsequently, the substrate 100 is removed. In a step of removing the substrate 100, a region extending from the upper side of the substrate to a portion of each of the electrodes 12a and 12b of the light-emitting element 10 is, for example, ground with a grinder. In the step of removing the substrate 100, a portion of the light-reflective member 21 and a portion of the bonding members 103 are removed. The bonding members 103 may be partially removed or entirely removed. Removing the substrate 100 allows the light-emitting devices 1 manufactured through the subsequent steps to be miniaturized. The substrate 100 can be removed by using a known method such as grinding, etching, cutting, and blasting. The substrate 100 is particularly preferably removed by grinding. This allows the exposed surface of the light-reflective member 21, the exposed surfaces of the electrodes 12a and the electrodes 12b, and the exposed surfaces of the bonding members 103 to be in the same plane, so that the first surface 23a of the intermediate structure 23 can be a flat surface. Accordingly, variations in the shapes, etc., of a plurality of light-emitting devices 1 can be reduced. Removal of the substrate 100 allows for providing the intermediate structure 23. The electrodes 12a and 12b are exposed on the first surface 23a of the intermediate structure 23. Removing the substrate 100 allows for reducing a length from the light emission surface to the back surface of the resulting light-emitting device 1 to, so that a small light-emitting device 1 can be obtained.

A step of cleaning is preferably performed after the step of removing the substrate 100. By performing the step of cleaning, chips generated in the removal of the substrate 100 can be effectively removed even if the remaining chips of the substrate 100 and other components have adhered to the surface of the intermediate structure 23. The step of cleaning is performed by, for example, spraying gas or liquid, spraying sublimable particles such as particles of solid carbon dioxide, or immersing in liquid.

One example of a case in which the intermediate structure 23 is provided by manufacturing has been described above. As described above, the intermediate structure 23 may be provided by, for example, purchasing the intermediate structure 23 as shown in FIG. 8A and FIG. 8B.

Forming First Groove 106

Figure 9A:
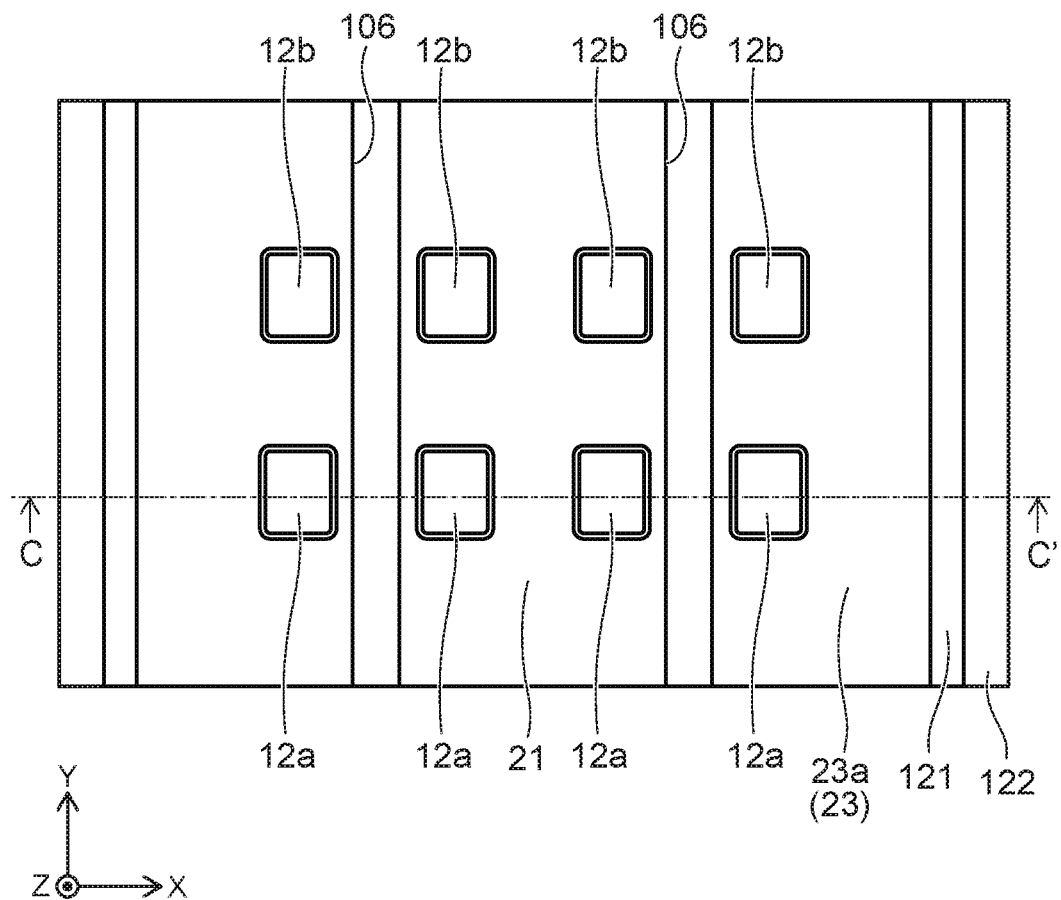
FIG. 9A is a schematic plan view for illustrating the method of manufacturing a light-emitting device according to the first embodiment.
Figure 9B:
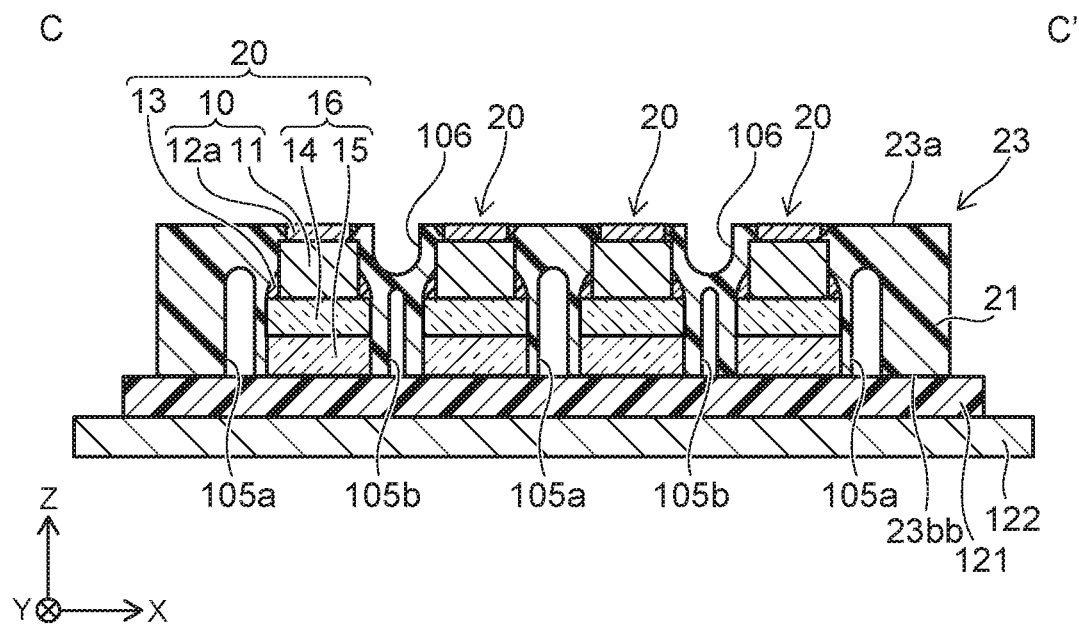
FIG. 9B is a schematic cross-sectional view taken along the line C-C' of FIG. 9A.

Subsequently, the first grooves 106 extending in the second direction (Y direction) are formed in the light-reflective member 21 between adjacent layered bodies 20 on the first surface 23a of the intermediate structure 23 as shown in FIG. 9A and FIG. 9B. The first grooves 106 are formed in order to dispose the electrically conductive film 25 on a surface of the light-emitting device 1 which will serve as the mounting surface of the light-emitting device 1 in a step of forming the electrically conductive film 25 described below. In the case in which the intermediate structure 23 has the second grooves 105, for example, the first grooves 106 are formed at positions facing the grooves 105b. The first grooves 106 preferably do not reach the grooves 105b. This structure allows for inhibiting the electrically conductive film 25 from being unintentionally formed at the light emission surface.

The first grooves 106 are preferably formed at positions facing alternate ones of the second grooves 105. The first grooves 106 are not formed at positions facing the grooves 105a but are formed at positions facing the grooves 105b in FIG. 9A and FIG. 9B. In the intermediate structure 23 shown in FIG. 9A and FIG. 9B, each first groove 106 is formed between adjacent two of layered bodies 20. In other words, two adjacent layered bodies 20 share a single first groove 106. With this structure, the distance between the layered bodies 20 can be smaller than in the case in which one first groove 106 is formed for each layered body 20. Accordingly, the number of light-emitting devices 1 to be obtained from one intermediate structure 23 can be increased.

The width of the first groove 106 is, for example, in a range of 0.45 times to 0.6 times, preferably 0.5 times to 0.55 times, the distance between adjacent electrodes 12a in the first direction (X direction). The width of the first groove 106 is 100 µm to 180 µm, preferably 120 µm to 160 µm on the first surface 23a of the intermediate structure 23. The width of the first groove 106 can be greater than the widths of the groove 105a and the groove 105b. This structure allows the volume of the electrically conductive film 25 formed inside the first groove 106 to be increased, which allows for improving the heat dissipation performance of the resulting light-emitting device 1.

Forming Electrically Conductive Film 25

Figure 10A:
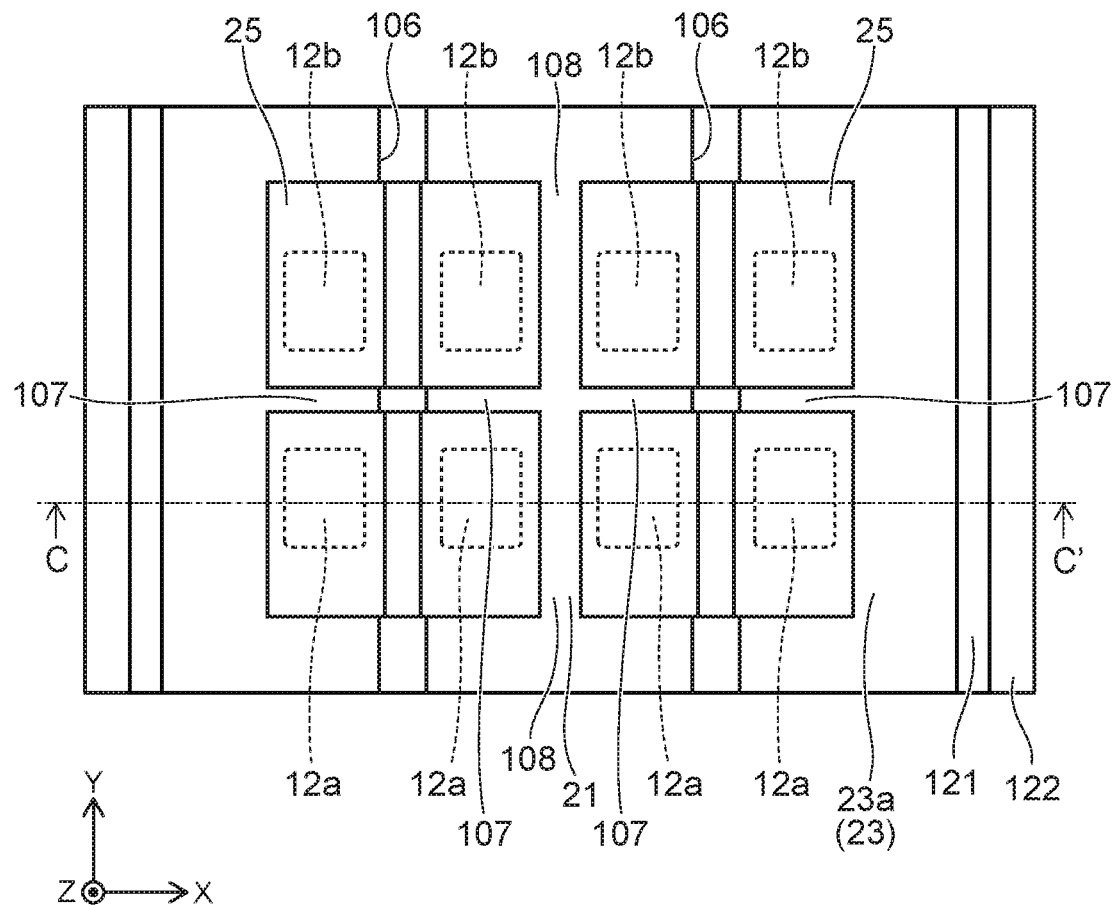
FIG. 10A is a schematic plan view for illustrating the method of manufacturing a light-emitting device according to the first embodiment.
Figure 10B:
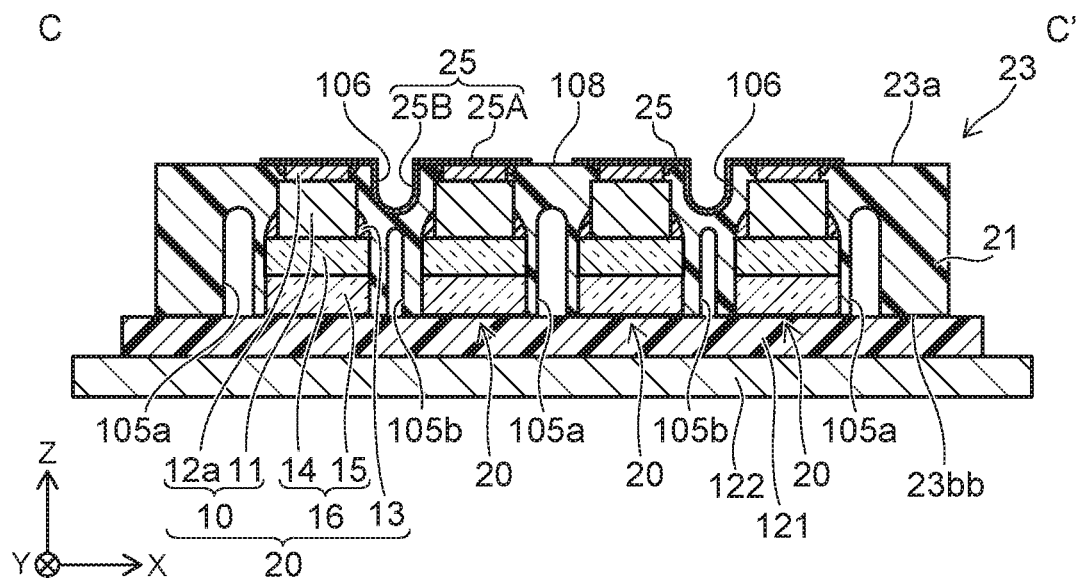
FIG. 10B is a schematic cross-sectional view taken along the line C-C' of FIG. 10A.

Subsequently, the electrically conductive film 25 is formed on the first surface 23a of the intermediate structure 23 and on inner surfaces defining the first grooves 106 as shown in FIG. 10A and FIG. 10B. The electrically conductive film 25 can be formed by using a known method such as sputtering, vacuum evaporation, application, stamping, printing, ALD, CVD, and plating. The electrically conductive film 25 is particularly preferably formed by sputtering. Forming the electrically conductive film 25 using sputtering allows for facilitating improvement in the bonding strength between the electrically conductive film 25 and the electrodes 12a and 12b exposed on the first surface 23a, and between the electrically conductive film 25 and the light-reflective member 21 located on the first surface 23a and the inner surfaces defining the first grooves 106. Accordingly, detachment of the electrically conductive film 25 from the first surface 23a and the inner surfaces defining the first grooves 106 can be inhibited.

The electrically conductive film 25 is preferably made of a material having good resistance to corrosion and oxidation. For example, the outermost layer of the electrically conductive film 25 is made of a platinum metal such as gold or platinum. In particular, the outermost surface of the electrically conductive film 25 is preferably made of gold, which has good solderability.

The electrically conductive film 25 may be formed of a single layer made of a single material or may have a layered structure made of different materials. The electrically conductive film 25 may be constituted of a layer containing gold, silver, tin, platinum, rhodium, titanium, ruthenium, molybdenum, tantalum, aluminum, tungsten, palladium, nickel, or an alloy of these metals. In particular, the electrically conductive film 25 preferably contains a high-melting-point metal such as ruthenium, molybdenum, and tantalum. This allows for improving heat resistance of the electrically conductive film 25. For example, in the case in which the electrically conductive film 25 is constituted of a plurality of layers, such a high-melting-point metal disposed inside the outermost layer of the electrically conductive film 25 allows for reducing diffusion of Sn contained in solder into the light-emitting device 1. For example, the electrically conductive film 25 can have a layered structure such as Ni/Ru/Au and Ti/Pt/Au. The thickness of the metal layer containing a high-melting-point metal such as ruthenium is preferably about 10 Å to 1,000 Å.

Exposing Light-Reflective Member 21 Located in Inter-Electrode Regions 107 and 108

Subsequently, the electrically conductive film 25 is selectively removed by using, for example, laser irradiation, etching, blasting, or photolithography. More specifically, a portion of the electrically conductive film 25 covering the inter-electrode region 107 between the electrode 12a and the electrode 12b on the first surface 23a is removed, and a portion of the electrically conductive film 25 covering a portion of the inter-electrode region 108 between adjacent electrodes 12a and between adjacent electrodes 12b in which the first groove 106 is not formed is removed. This causes light-reflective member 21 located in the inter-electrode regions 107 and 108 to be exposed. On the other hand, the electrodes 12a and 12b are covered with the electrically conductive film 25. The inner surfaces defining the first grooves 106 are also covered with the electrically conductive film 25.

For selectively removing a portion of the electrically conductive film 25, laser irradiation is preferably used. The electrically conductive film 25 can be patterned by using laser irradiation without a mask or the like. Irradiation of the electrically conductive film 25 with laser light causes laser ablation, so that a portion of the electrically conductive film 25 can be removed. The laser ablation is a phenomenon in which a surface of a solid is removed when the radiation intensity of laser light applied on the surface of the solid is at a certain value (threshold) or greater.

In the case in which the electrically conductive film 25 is removed by using laser irradiation, the wavelength of the laser light is preferably a wavelength at which the reflectance with respect to the electrically conductive film 25 is low, such as a wavelength at which the reflectance is 90% or less. For example, in the case in which the outermost surface of the electrically conductive film 25 is made of gold (Au), a laser light with a wavelength shorter than wavelengths in the green range (such as 550 nm) is preferably used rather than a laser light in the red range (such as 640 nm). This constitution can improve the efficiency of laser ablation and enhance mass production.

The shape of the electrically conductive film 25 in a plan view on the first surface 23a can be rectangular, circular, elliptic, or a combination of these shapes. The outer periphery of the electrically conductive film 25 on the first surface 23a can be a straight line, a curved line, or a combination of a straight line and a curved line. For example, the electrically conductive film 25 on the first surface 23a can be L-shaped or T-shaped in a plan view. The shape of the electrically conductive film 25 on the electrode 12a in a plan view may differ from the shape of the electrically conductive film 25 on the electrode 12b in a plan view. Different shapes of the electrically conductive films 25 in a plan view facilitate, for example, recognition of the polarities of the light-emitting device 1.

The thickness of a portion of the electrically conductive film 25 located on the first surface 23a and the thickness of a portion of the electrically conductive film 25 located on the inner surface defining the first groove 106 may be the same or different. With the electrically conductive film 25 having a thickness on the first surface 23a greater than a thickness of the electrically conductive film 25 on the inner surface defining the first groove 106, heat generated by the light-emitting element 10 can be efficiently dissipated to the outside through the electrically conductive film 25 located on the first surface 23a. With the electrically conductive film 25 having a thickness on the inner surface defining the first groove 106 greater than a thickness of the electrically conductive film 25 on the first surface 23a, heat generated by the light-emitting element 10 can be efficiently dissipated toward the mounting board through the electrically conductive film 25 located on the inner surface defining the first groove 106. The thickness of the electrically conductive film 25 is, for example, in a range of 0.01 μm to 0.2 μm, preferably 0.05 μm to 0.1 μm.

A portion of the electrically conductive film 25 located on the first surface 23a and a portion of the electrically conductive film 25 located on the inner surface defining the first groove 106 may be partially apart from each other as long as the electrically conductive films 25 are electrically connected to each other via a bonding member when mounting the resulting light-emitting device 1. For example, the electrically conductive film 25 located on the first surface 23a and the electrically conductive film 25 located on the surface defining the first groove 106 may be apart from each other at the corner at which the first surface 23a is connected to the inner surface defining the first groove 106. The corner at which the first surface 23a is connected to the surface defining the first groove 106 is likely to be chipped or deformed by external force. Accordingly, if the electrically conductive film 25 located on the first surface 23a and the electrically conductive film 25 located on the inner surface defining the first groove 106 are apart from each other in the vicinity of the corner, the possibility that the external force affects each electrically conductive film 25 can be reduced even in the case in which the external force is applied to the corner. The distance between the electrically conductive film 25 located on the first surface 23a and the electrically conductive film 25 located on the inner surface defining the first groove 106 can be, for example, half or less of the thickness of a block of the bonding member (such as solder) before melting.

Making Hole 109

Figure 11A:
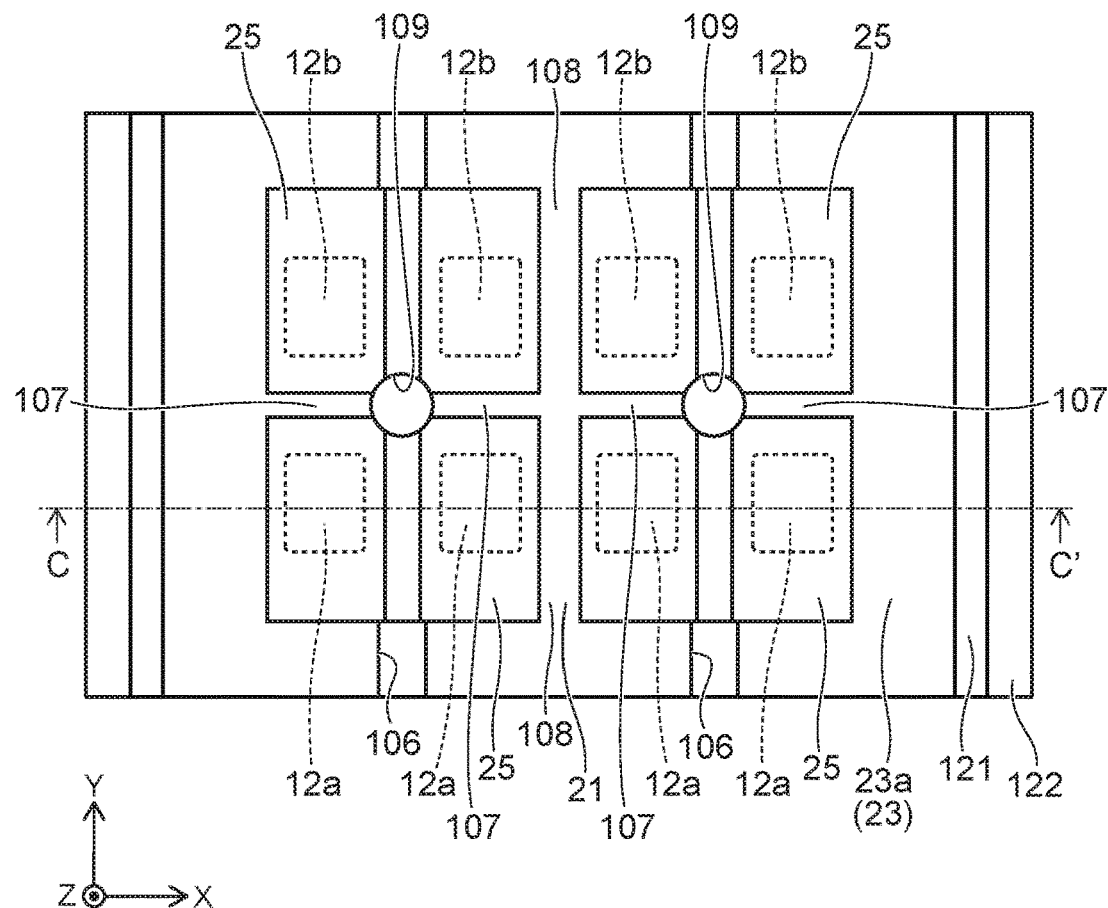
FIG. 11A is a schematic plan view for illustrating the method of manufacturing a light-emitting device according to the first embodiment.
Figure 11B:
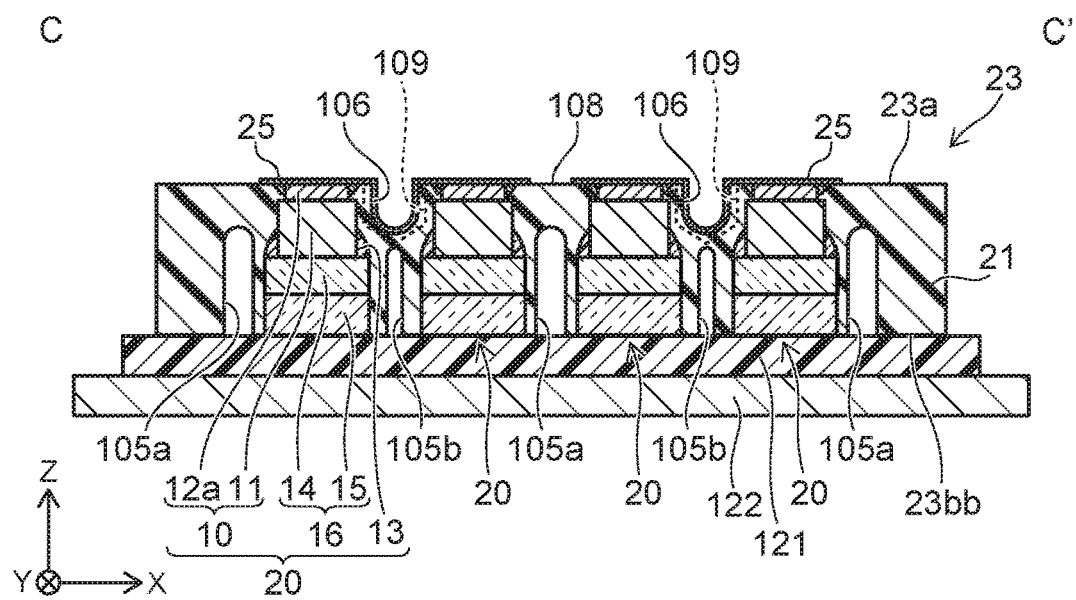
FIG. 11B is a schematic cross-sectional view taken along the line C-C' of FIG. 11A.

Subsequently, the holes 109 are made at positions overlapping with the first grooves 106 on the intermediate structure 23 as shown in FIG. 11A and FIG. 11B. The holes 109 are formed with, for example, a drill. Each of the holes 109 is formed at a position that overlaps with the first groove 106 and is located between two adjacent inter-electrode regions 107. The width, such as the diameter, of the hole 109 in the first direction (X direction) is equal to or greater than the width of the first groove 106. The depth of the hole 109 is greater than the depth of the first groove 106. The hole 109 may reach the groove 105b. The hole 109 divides the first groove 106 in the second direction (Y direction), so that a portion of the electrically conductive film 25 located inside the first groove 106 and located between two inter-electrode regions 107 adjacent to each other across the first groove 106 is removed. Accordingly, a portion of the electrically conductive film 25 connected to the electrodes 12a is apart from a portion of the electrically conductive film 25 connected to the electrodes 12b.

The hole 109 can be made by a known method using, for example, a drill or a laser. In the case in which the hole 109 is made with a drill, a drill tapering down toward the tip of the drill is preferably used. Using such a drill can facilitate locally forming the hole 109, so that the step of forming the hole 109 is easily performed. With the drill tapering down toward the tip of the drill, the depth of the hole 109 in the third direction (Z direction) is likely to be maximum at the center of the hole 109. In the case in which the drill tapering down toward the tip is used, the deepest portion of the hole 109 has a substantially conical shape, and a portion of the hole 109 in the vicinity of the opening of the hole 109 has a substantially cylindrical shape.

The width of the hole 109 in the first direction (X direction) is greater than the width of the first groove 106 in the first direction (X direction). With such a width, the electrically conductive film 25 can be surely divided. The hole 109 has such a width that a portion of the hole 109 with a greatest width in the first direction (X direction) is not in contact with the lateral surface of the light-emitting element 10. The distance between the widest portion of the hole 109 and the lateral surface of the light-emitting element 10 in the first direction (X direction) is, for example, in a range of 15 μm to 50 μm, preferably 20 μm to 30 μm. This structure allows for reducing leakage of light emitted from the light-emitting element 10 through the inner surface defining the hole 109 to the outside in the resulting light-emitting device 1. The width of the hole 109 is, for example, 140 μm to 220 μm, preferably 160 μm to 200 μm.

The depth of the hole 109 is greater than the depth of the first groove 106. This allows for surely dividing the electrically conductive film 25. The bottom surface of the hole 109 can be located at a position lower than the upper surface of the light-emitting element 10 in the third direction (Z direction). This structure allows for reducing leakage, through the hole 109 to the outside, of light emitted from the lateral surface of the light-transmissive member 16 of the resulting light-emitting device 1. The depth of the hole 109 is, for example, in a range of 10 μm to 200 μm, preferably 50 μm to 150 μm.

Obtaining Plurality of Light-Emitting Devices 1

Figure 12A:
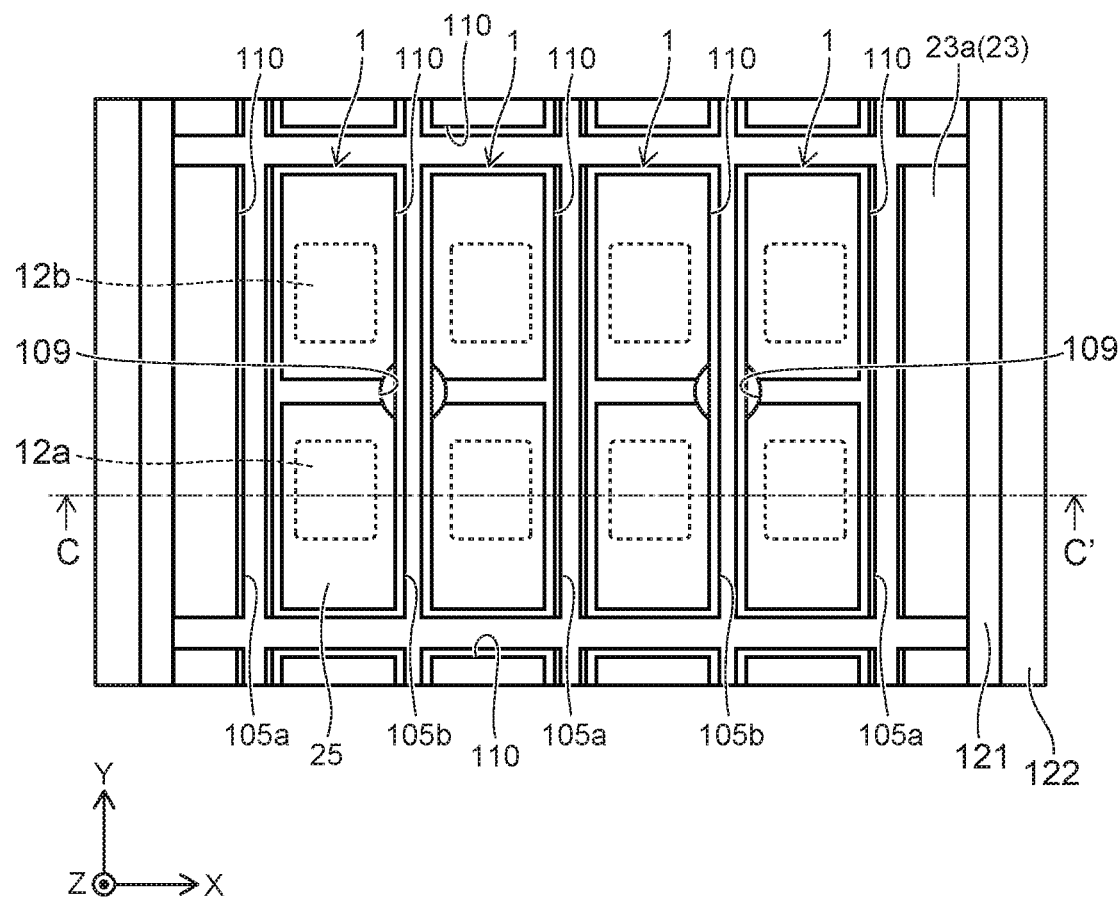
FIG. 12A is a schematic plan view for illustrating the method of manufacturing a light-emitting device according to the first embodiment.
Figure 12B:
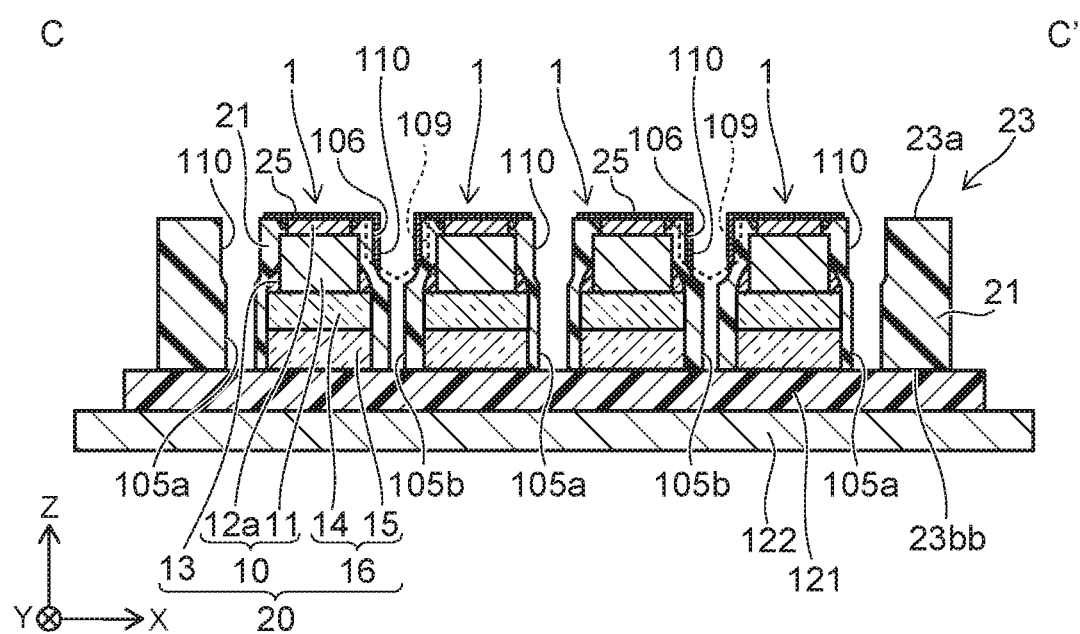
FIG. 12B is a schematic cross-sectional view taken along the line C-C' of FIG. 12A.

Subsequently, the intermediate structure 23 is cut from the first surface 23a side to form third grooves 110 as shown in FIG. 12A and FIG. 12B. The third grooves 110 are formed at positions facing the grooves 105a and the grooves 105b. The third grooves 110 reach the grooves 105a and the grooves 105b. Accordingly, the third grooves 110, the grooves 105a, and the grooves 105b penetrate through the intermediate structure 23 in the third direction (Z direction) to divide the intermediate structure 23. By forming the third grooves 110 as described above, the electrically conductive films 25 and the light-reflective member 21 are cut along the first grooves 106. Accordingly, a plurality of light-emitting devices 1 are obtained. The cutting is preferably performed by, for example, using dicing with a fluid such as water being poured on the cut surface of the intermediate structure 23. This operation allows for reducing deformation of the light-reflective member 21 or other components due to heat generated by cutting. A known cutting method such as dicing including dry cutting, laser cutting, etc., can be used.

The width of the third grooves 110 is preferably greater than the widths of the grooves 105a and the grooves 105b and smaller than the width of the first grooves 106. With the third grooves 110 having a width greater than widths of the grooves 105a and the grooves 105b, the width of the light-emitting device 1 at electrodes 12a and 12b can be inhibited from being greater than the width of the light-emitting device 1 at the light-transmissive member 16. This allows miniaturization of the light-emitting device 1. With the third grooves 110 having a width smaller than a width of the first grooves 106, a portion of the electrically conductive film 25 formed inside the first grooves 106 can be remained. It is preferable that the distance between the widest portion of each third groove 110 and the lateral surface of the light-emitting element 10 in the first direction (X direction) be, for example, in a range of 20 μm to 60 μm, preferably 30 μm to 40 μm. This structure can reduce leakage of light emitted from the lateral surface of the light-emitting element 10 to the outside. The width of the third grooves 110 is, for example, 60 μm to 140 μm, preferably 80 μm to 120 μm.

The third grooves 110 has such a depth that the third grooves 110 reach the grooves 105a and the grooves 105b. The third grooves 110 are preferably formed such that the deepest portions (bottom surfaces) of the third grooves 110 are located at a position higher than the upper surfaces of the light-emitting elements 10 in the third direction (Z direction). This allows for maintaining a great thickness of the light-reflective member 21 located at a lateral side of the light-transmissive members 16. Accordingly, leakage of light from the lateral surfaces 16a and 16b of the light-transmissive members 16 through the light-reflective member 21 to the outside can be reduced. The depth of the third grooves 110 is, for example, in a range of 50 μm to 300 μm, preferably 100 μm to 200 μm. The depth of a third groove 110 facing a groove 105a may differ from the depth of a third groove 110 facing a groove 105b. For example, the depth of the third groove 110 facing the groove 105b can be greater than the depth of the third groove 110 facing the groove 105a. This allows for increasing a size of a recessed portion formed at the mounting surface of the light-emitting device 1. Accordingly, for example, even in the case in which an excessive amount of the bonding member 52 is applied between the light-emitting device 1 and the mounting board 51, the surplus bonding member 52 can be accommodated in the recessed portion. This structure allows for reducing the possibility that the light-emitting device 1 is disposed such that the light extraction surface 30a of the light-emitting device 1 is inclined.

Subsequently, the light-emitting device according to the present embodiment manufactured as described above and the light source device including the light-emitting device will be described.

Figure 13A:
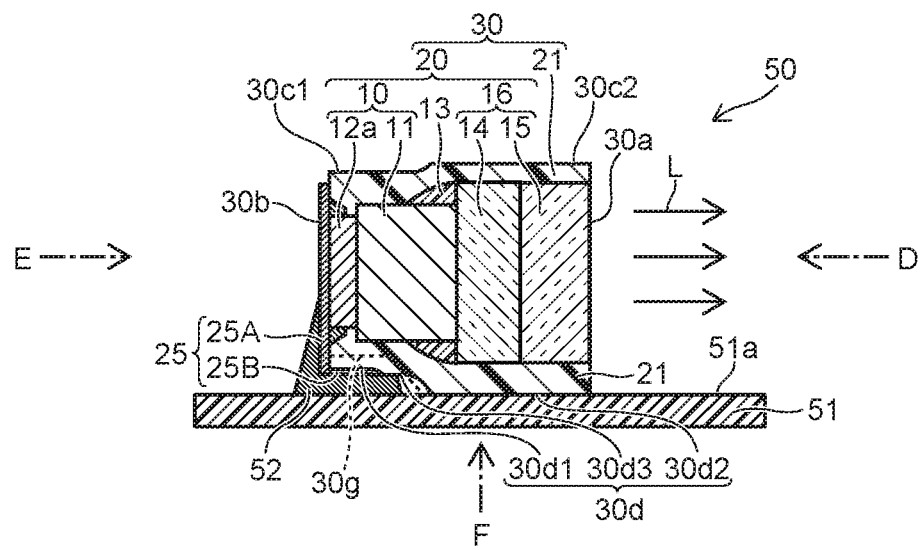
FIG. 13A is a schematic cross-sectional view of a light source device according to the first embodiment.
Figure 13B:
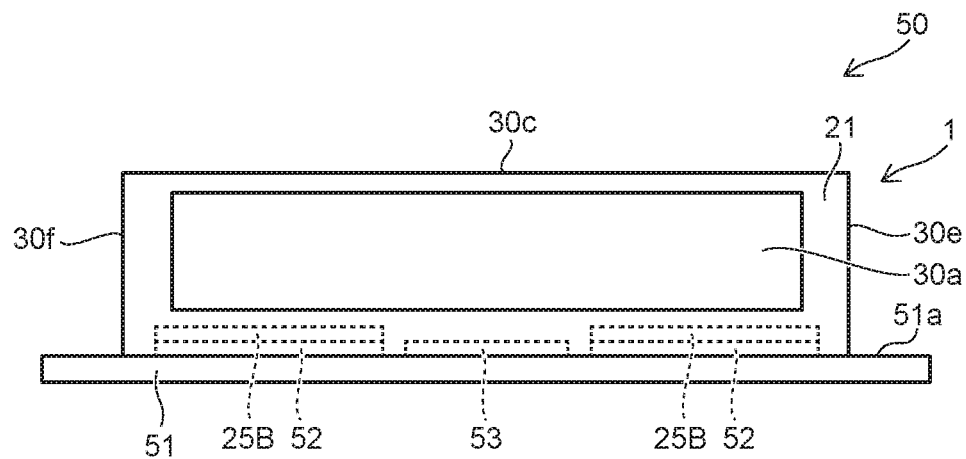
FIG. 13B is a schematic front view of the light source device according to the first embodiment.

FIG. 13A is a schematic cross-sectional view of the light source device according to the present embodiment. FIG. 13B is a schematic front view of the light source device according to the present embodiment.

Figure 14A:
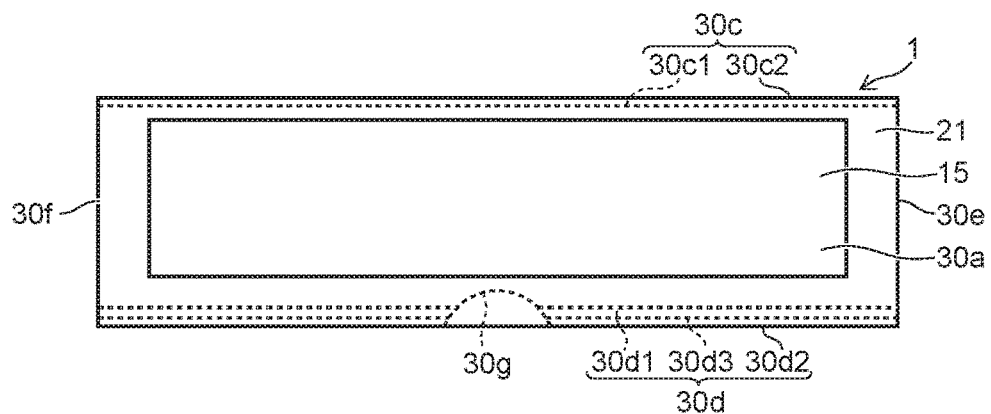
FIG. 14A is a schematic front view of a light-emitting device according to the first embodiment.
Figure 14B:
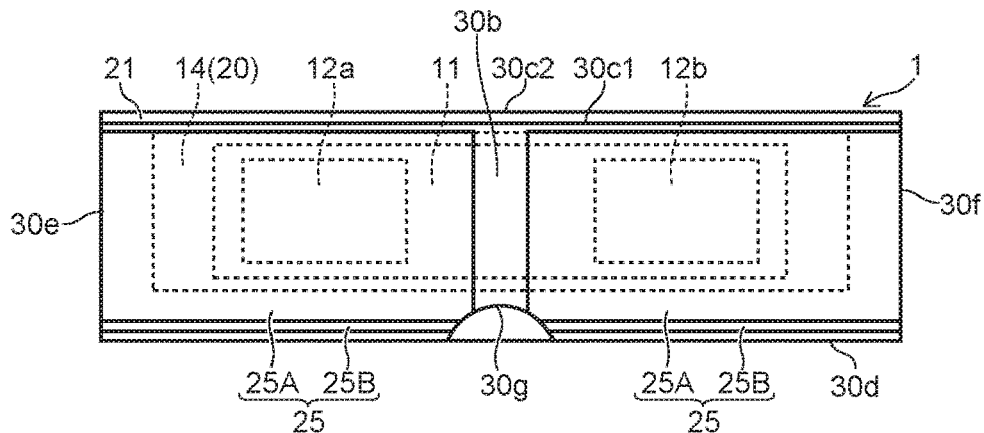
FIG. 14B is a schematic back view of the light-emitting device according to the first embodiment.
Figure 14C:
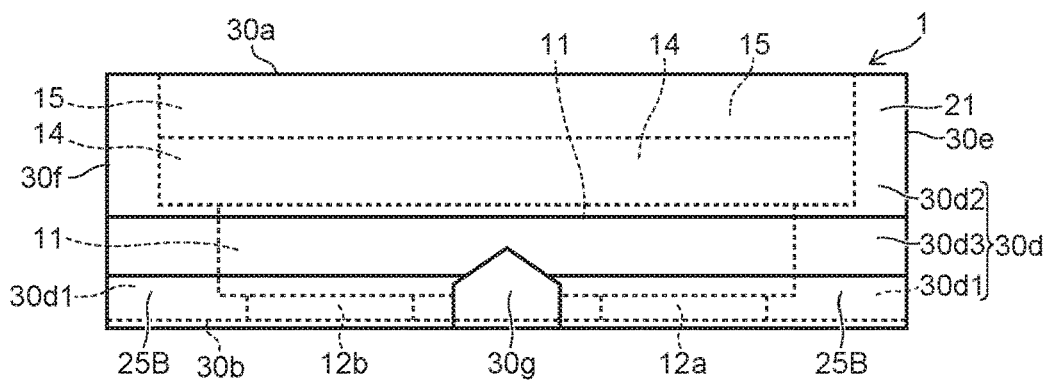
FIG. 14C is a schematic bottom view of the light-emitting device according to the first embodiment.

FIG. 14A is a schematic front view of the light-emitting device according to the present embodiment. FIG. 14B is a schematic back view of the light-emitting device according to the present embodiment. FIG. 14C is a schematic bottom view of the light-emitting device according to the present embodiment.

FIG. 13B is a schematic view of a light source device 50 viewed in the direction D of FIG. 13A. FIG. 14A is a schematic view of the light-emitting device 1 viewed in the direction D of FIG. 13A. FIG. 14B is a schematic view of the light-emitting device 1 viewed in the direction E. FIG. 14C is a schematic view of the light-emitting device 1 viewed in the direction F.

The light source device 50 according to the present embodiment includes the mounting board 51, the light-emitting device 1, and a pair of bonding members 52. The light-emitting device 1 is bonded to the mounting board 51 with the pair of bonding members 52. The bonding members 52 are made of, for example, solder or electrically-conductive paste. In FIG. 14A to FIG. 14C, illustration of the mounting board 51 and the bonding members 52 is omitted.

Light-Emitting Device 1

The light-emitting device 1 according to the present embodiment will be described below referring to FIG. 13A, FIG. 13B, and FIG. 14A to FIG. 14C. The light-emitting device 1 includes a structure 30 that includes the light-emitting element 10 including the pair of electrodes, the light-transmissive member 16 disposed on or above the light-emitting element 10, and the light-reflective member 21 covering lateral surfaces of the layered body 20 including the light-emitting element 10 and the light-transmissive member 16; a pair of first electrically conductive films 25A disposed on a first surface of the structure 30; and a pair of second electrically conductive films 25B disposed on a second surface of the structure 30.

The structure 30 has the light extraction surface 30a, a first surface 30b opposite to the light extraction surface 30a, a second surface 30d connected to the light extraction surface 30a and the first surface 30b, a third surface 30c opposite to the second surface 30d, a fourth surface 30e, and a fifth surface 30f. The light extraction surface 30a is connected to the second surface 30d, the third surface 30c, the fourth surface 30e, and the fifth surface 30f across edge lines. The first surface 30b is connected to the second surface 30d, the third surface 30c, the fourth surface 30e, and the fifth surface 30f across edge lines. The fourth surface 30e and the fifth surface 30f are flat and entirely constituted of the light-reflective member 21.

In the present specification, surfaces of the light-emitting device 1 corresponding to the surfaces of the structure 30 are described using the same terms as for the structure 30, such as the light extraction surface 30a and the first surface 30b. The light-emitting device 1 is a side-view type light-emitting device in which the second surface 30d serves as the mounting surface and faces an upper surface 51a of the mounting board 51. The light extraction surface 30a is parallel to and faces in the same direction as the upper surface 100a of the substrate 100 shown in FIG. 1A, FIG. 1B, and other drawings.

The structure 30 includes at least one layered body 20. The layered body 20 functions as the light source of the light-emitting device 1 and includes the light-emitting element 10 and the light-transmissive member 16. For example, the light-emitting element 10 is a light-emitting diode (LED) and includes the semiconductor layered body 11 and the pair of electrodes 12a and 12b. In the semiconductor layered body 11, the n-layer, the light-emitting layer, and the p-layer are layered. One of the n-layer and the p-layer is connected to the electrode 12a, and the other one of the n-layer and the p-layer is connected to the electrode 12b. The pair of electrodes 12a and 12b are exposed from the light-reflective member 21 on the first surface 30b of the structure 30. With this structure, heat generated by the light-emitting element 10 can be efficiently dissipated from the first surface 30b of the structure. The first surface 30b is flat, and the light-reflective member 21 is disposed around the electrodes 12a and 12b in FIG. 13A and FIG. 14C.

The light-transmissive member 16 is disposed on the light-emitting element 10. With the light-transmissive member 16 disposed on the light-emitting element 10, the light-emitting element 10 can be protected against an external stress. The lateral surfaces of the light-transmissive member 16 are covered with the light-reflective member 21. This structure allows for increasing the contrast between a light-emitting region and a non-light-emitting region, so that a light-emitting device having good visibility can be obtained. The light extraction surface 30a is flat, and the light-reflective member 21 is disposed around the light-transmissive member 16 in FIG. 13A and FIG. 14A.

The light-transmissive member 16 can include the phosphor layer 14 and/or the light-transmissive layer 15. The light-transmissive member 16 preferably includes the phosphor layer 14 containing a phosphor. With this structure, a color of light emitted from the light-emitting element 10 and a color of light emitted from the phosphor are mixed, so that a desired mixed colored light can be emitted. The phosphor may be uniformly dispersed in the phosphor layer 14 or may be dispersed predominantly at the light-emitting element 10 side rather than the upper surface of the phosphor layer 14. With the phosphor dispersed predominantly at the light-emitting element 10 side rather than the upper surface of the phosphor layer 14, deterioration of a phosphor, which is vulnerable to water, caused by water can be easily reduced. Examples of the phosphor vulnerable to water include manganese-activated fluoride phosphors. Manganese-activated fluoride phosphors can emit light having a comparatively narrow spectral linewidth, and thus are preferable in view of color reproducibility. For the phosphor, one type of phosphor or two or more types of phosphors can be used.

The phosphor layer 14 can include a plurality of phosphor layers. For example, the phosphor layer 14 can include a phosphor layer containing a manganese-activated fluoride phosphor and a phosphor layer containing a β-SiAlON phosphor. The phosphor layer 14 may be made of a single layer. The single-layer phosphor layer 14 may contain a manganese-activated fluoride phosphor and a β-SiAlON phosphor.

In the layered body 20, the light guide member 13 may be disposed between the light-emitting element 10 and the light-transmissive member 16. The light guide member 13 covers lateral surfaces of the light-emitting element 10 and guides light emitted from the lateral surfaces of the light-emitting element 10 toward the upper surface (light extraction surface 30a) of the light-emitting device 1. The light guide member 13 disposed on the lateral surfaces of the light-emitting element 10 allows for reducing attenuation, inside the light-emitting element 10, of a portion of light that has reached a lateral surface of the light-emitting element 10 due to reflection by the lateral surface. The light guide member 13 can cover the upper surface and the lateral surfaces of the light-emitting element 10. This structure can increase the adhesion strength between the light-emitting element 10 and the light guide member 13. For example, the light guide member 13 contains a resin material as the base material. For example, light-transmissive resins such as silicone resins, modified silicone resins, epoxy resins, or phenolic resins can be preferably used for the resin material. The light guide member 13 preferably has a high light transmittance. Accordingly, the light guide member 13 preferably contains no substance that reflects, absorbs, or scatters light. A member that has a higher transmittance with respect to light emitted from the light-emitting element 10 than the light-reflective member 21 is selected for the light guide member 13.

The light-reflective member 21 constitutes the outer surfaces of the light-emitting device 1. In the light-emitting device 1 shown in FIG. 13A, FIG. 13B, and FIG. 14A to FIG. 14C, the light-reflective member 21 is located on all outer surfaces including the light extraction surface 30a, the first surface 30b, the second surface 30d, the third surface 30c, the fourth surface 30e, and the fifth surface 30f. The light-reflective member 21 covers lateral surfaces of the light-emitting element 10 and the lateral surfaces of the light-transmissive member 16. As the light-reflective member 21 is located at a lateral side of the light-emitting element 10, light emitted laterally from the light-emitting element 10 can be reflected by the light-reflective member 21, so that the light can be efficiently extracted in the upper direction. The light-reflective member 21 also preferably covers the lower surface of the light-emitting element 10. This structure allows, for example, light emitted downward from the light-emitting element 10 to be reflected upward. With the light-reflective member 21 covering the lower surface of the light-emitting element 10, the adhesion strength between the light-emitting element 10 and the light-reflective member 21 can be increased.

The material of the light-reflective member 21 is preferably selected such that, for example, the relation between the difference in thermal expansion coefficient (referred to as a "first difference ΔT30 in thermal expansion coefficient") between the light guide member 13 and the light-emitting element 10 and the difference in thermal expansion coefficient (referred to as a "second difference ΔT40 in thermal expansion coefficient") between the light-reflective member 21 and the light-emitting element 10 satisfies ΔT40<ΔT30. With such a material, detachment of the light guide member 13 from the light-emitting element 10 can be inhibited.

The light-reflective member 21 constitutes the third surface 30c. The third surface 30c includes an electrode side region 30c1 at the pair of electrodes 12a and 12b side and a light-emission side region 30c2 at the light-transmissive member 16 side. The electrode side region 30c1 is recessed inward relative to the light-extraction side region 30c2 in a direction from the third surface 30c toward the second surface 30d. The electrode side region 30c1 is a lateral surface of the third groove 110, and the light-extraction side region 30c2 is the lateral surface 105a1 of the groove 105a.

As shown in FIG. 14C, the second surface 30d includes a first region 30d1 (electrode side region) at the pair of electrodes 12a and 12b, a second region 30d2 (light-extraction side region) at the light-transmissive member 16, and an intermediate region 30d3 between the first region 30d1 and the second region 30d2. The intermediate region 30d3 is recessed inward relative to the second region 30d2 (light-extraction side region), and the first region 30d1 (electrode side region) is recessed inward relative to the intermediate region 30d3. Accordingly, the first region 30d1 (electrode side region) is recessed inward relative to the second region 30d2 (light-extraction side region). With this structure, the bonding members 52 are easily disposed between the mounting board 51 and the first region 30d1 (electrode side region) when the light-emitting device 1 is mounted on or above the mounting board 51. The second region 30d2 (light-extraction side region) is the lateral surface 105b1 forming the groove 105b, the intermediate region 30d3 is a lateral surface forming the third groove 110, and the first region 30d1 (electrode side region) is a lateral surface forming the first groove 106.

A recess 30g is formed on the second surface 30d. The recess 30g extends through the first region 30d1 (electrode side region) from the first surface 30b and reaches a portion of the intermediate region 30d3. The recess 30g divides the first region 30d1 (electrode side region) into two portions. The recess 30g is located between the pair of second electrically conductive films 25B. The recess 30g may reach the second region 30d2 (light-extraction side region). The bonding strength between the light-emitting device 1 and the mounting board 51 can be enhanced by, for example, disposing an adhesive or the like described later into the recess 30g.

The pair of first electrically conductive films 25A are disposed on the first surface 30b of the structure 30. The pair of first electrically conductive films 25A are apart from each other, respectively cover the pair of electrodes 12a and 12b, and are respectively connected to the electrodes 12a and 12b. On the first surface 30b of the light-emitting device 1, only the light-reflective member 21 and the pair of first electrically conductive films 25A are exposed. The pair of first electrically conductive films 25A located on the first surface 30b allow heat generated from the light-emitting element 10 to be efficiently dissipated from the first surface 30b.

The first electrically conductive films 25A on the first surface 30b are preferably apart from the third surface 30c. This structure allows for reducing the possibility that the tombstone phenomenon of the light-emitting device 1 occurs when the light-emitting device 1 is mounted on or above the mounting board using bonding members such as solder, and the possibility that the light-emitting device 1 is disposed with the light extraction surface 30a of the light-emitting device 1 being inclined.

The first electrically conductive films 25A may extend to the third surface 30c. In this case, for example, the edges of the first electrically conductive films 25A can coincide with the edge of the third surface 30c. The first electrically conductive films 25A can also be formed partially on the third surface 30c in addition to the first surface 30b. This allows for improving heat dissipation performance of the light-emitting device 1.

The pair of first electrically conductive films 25A on the first surface 30b are preferably apart from the fourth surface 30e and the fifth surface 30f. This structure allows for inhibiting the bonding members from flowing beyond the fourth surface 30e and the fifth surface 30f when the light-emitting device 1 is mounted on the mounting board via the bonding members. Accordingly, the mounting area of the light-emitting device 1 including the bonding members can be reduced. For example, in the case in which a plurality of light-emitting devices disposed on a mounting board are used for a light source for an edge-emission type liquid-crystal display device, the gaps between the light-emitting devices are likely to be dark. However, in the case in which a plurality of light-emitting devices 1 including the first electrically conductive films 25A arranged as described above are disposed on a mounting board such that the fourth surface 30e of one light-emitting device faces the fifth surface 30f of adjacent light-emitting device, the distance between the light-emitting devices can be reduced. This allows for reducing dark portions between the light-emitting devices can thus be reduced. The corner of the light-emitting device 1 including the portion at which the fourth surface 30e or the like is connected to the first surface 30b is likely to be chipped or deformed by external force. However, with the first electrically conductive films 25A apart from the fourth surface 30e and the like, the possibility that the external force affects the first electrically conductive films 25A can be reduced even when an external force is applied to a corner of the light-emitting device 1.

The first electrically conductive films 25A may extend to the fourth surface 30e and the fifth surface 30f. In this case, for example, the edges of the first electrically conductive films 25A can coincide with the edges of the fourth surface 30e and the fifth surface 30f. The first electrically conductive films 25A can also be formed partially on the fourth surface 30e and the fifth surface 30f in addition to the first surface 30b. Such a structure allows for improving heat dissipation performance of the light-emitting device 1.

The pair of second electrically conductive films 25B are disposed on the first region 30d1 (electrode side region) of the second surface 30d of the structure 30. The pair of second electrically conductive films 25B are apart from each other and are respectively continuous with the pair of first electrically conductive films 25A. Accordingly, one of the pair of second electrically conductive films 25B is formed integrally with one of the pair of first electrically conductive films 25A to constitute one of the electrically conductive films 25 and is connected to the electrode 12a. The other one of the pair of second electrically conductive films 25B is formed integrally with the other one of the pair of first electrically conductive films 25A to constitute the other one of the electrically conductive films 25 and is connected to the electrode 12b. The pair of electrically conductive films 25 function as the electrodes for mounting the light-emitting device 1. The second electrically conductive films 25B are not disposed on the intermediate region 30d3, the second region 30d2 (light-extraction side region), or the inner surface defining the recess 30g on the second surface 30d (mounting surface). With the pair of second electrically conductive films 25B located on the second surface 30d, heat generated by the light-emitting element 10 can be efficiently dissipated from the second surface 30d.

The second electrically conductive films 25B on the second surface 30d are preferably apart from the light extraction surface 30a. This structure allows for inhibiting the bonding members from flowing to the light extraction surface 30a, which serves as the light emission surface, when the light-emitting device 1 is mounted on the mounting board via the bonding members. Accordingly, for example, the possibility that light emitted from the light-emitting device 1 is blocked by the bonding members can be reduced.

The second electrically conductive films 25B may extend to the light extraction surface 30a. In this case, for example, the edges of the second electrically conductive films 25B can coincide with the edge of the light extraction surface 30a. The second electrically conductive films 25B can also be formed partially on the light extraction surface 30a in addition to the second surface 30d. This structure allows for improving heat dissipation performance of the light-emitting device 1.

The pair of second electrically conductive films 25B on the second surface 30d are preferably apart from the fourth surface 30e and the fifth surface 30f. This structure allows for inhibiting the bonding members from flowing beyond the fourth surface 30e and the fifth surface 30f when the light-emitting device 1 is mounted on the mounting board via the bonding members. Accordingly, the mounting area of the light-emitting device 1 including the bonding members can be reduced. For example, in the case in which a plurality of light-emitting devices disposed on or above a mounting board are used as a light source of an edge-type liquid-crystal display devices, the gaps between the light-emitting devices are likely to be dark. However, in the case in which a plurality of light-emitting devices 1 including the second electrically conductive films 25B arranged as described above are disposed on a mounting board such that the fourth surface 30e of one light-emitting device faces the fifth surface 30f of another adjacent light-emitting device, the distance between the light-emitting devices can be reduced. This allows for reducing dark portions between the light-emitting devices. The corner of the light-emitting device 1 including the portion at which the fourth surface 30e or the like is connected to the second surface 30d is likely to be chipped or deformed by external force. However, with the second electrically conductive films 25B apart from the fourth surface 30e and the like, the possibility that the external force affects the second electrically conductive films 25B can be reduced even in the case in which the external force is applied to a corner of the light-emitting device 1.

The second electrically conductive films 25B may extend to the fourth surface 30e and the fifth surface 30f. In this case, for example, the edges of the second electrically conductive films 25B can coincide with the edges of the fourth surface 30e and the fifth surface 30f. The second electrically conductive films 25B can also be formed partially on the fourth surface 30e and the fifth surface 30f in addition to the second surface 30d. This allows for improving heat dissipation performance of the light-emitting device 1.

Light Source Device 50

The light source device 50 in which the light-emitting device 1 is disposed on or above the mounting board 51 will next be described referring to FIG. 13A and FIG. 13B. The light-emitting device 1 is disposed on the mounting board 51 such that the second surface 30d serves as the mounting surface.

The mounting board 51 includes a base and a wiring pattern disposed on the base. The mounting board 51 is, for example, a member with an elongated shape having a longitudinal direction and a width direction. A plurality of light-emitting devices 1 can be disposed on the mounting board 51. The light-emitting devices 1 are preferably arranged on the mounting board 51 along the longitudinal direction of the mounting board 51.

The light-emitting device 1 and the mounting board 51 are bonded together mainly with the pair of bonding members 52. The pair of bonding members 52 are made of electrically-conductive members such as solder. The light-emitting device 1 and the mounting board 51 can be bonded together using an adhesive member 53 in addition to the pair of bonding members 52. The adhesive member 53 is, for example, an insulating adhesive. In the light source device 50 shown in FIG. 13B, the adhesive member 53 bonds the second surface 30d (mounting surface) of the light-emitting device 1 to the upper surface 51a of the mounting board 51. Using the adhesive member 53 in addition to the pair of bonding members 52 further enhances the bonding strength between the light-emitting device 1 and the mounting board 51.

The pair of bonding members 52 are disposed at least between the first region 30d1 (electrode side region) of the second surface 30d of the light-emitting device 1 and the upper surface 51a of the mounting board 51, and each of the pair of bonding members 52 is in contact with a respective one of the pair of second electrically conductive films 25B. Accordingly, the bonding members 52 bond the light-emitting device 1 to the mounting board 51. For example, the bonding members 52 are also disposed on the first surface 30b (back surface) of the light-emitting device 1 and between the intermediate region 30d3 of the second surface 30d (mounting surface) and the mounting board 51 and are also in contact with the first electrically conductive films 25A.

On the second surface 30d (mounting surface) of the light-emitting device 1, the adhesive member 53 is preferably in contact with a region between the pair of bonding members 52. This structure allows for inhibiting, for example, the pair of bonding members 52 from being unintentionally connected to each other in the case in which an insulating adhesive material is used for the adhesive member 53. In other words, with the insulating adhesive member 53 disposed between the pair of bonding members 52 on the second surface 30d (mounting surface) of the light-emitting device 1, a short circuit between the terminals can be easily inhibited. In addition, as the adhesive member 53 is not located outward of the bonding members 52, flowing of the adhesive member 53 beyond the fourth surface 30e and the fifth surface 30f can be reduced. This structure is effective particularly in the case in which the viscosity of the material constituting the adhesive member 53 is lower than the viscosity of the material constituting the bonding members 52. The mounting area of the light-emitting device 1 can thus be reduced.

The adhesive member 53 can be disposed in the recess 30g. This structure allows for increasing the adhesion strength between the adhesive member 53 and the light-emitting device 1. Even in the case in which the light source device 50 does not include the adhesive member 53, the recess 30g on the second surface 30d (mounting surface) of the light-emitting device 1 inhibits the pair of bonding members 52 from unintentionally being brought into contact with each other.

For example, an epoxy resin can be used for the adhesive member 53. In this case, for example, using an epoxy resin for the resin material serving as the base material of the light-reflective member 21 allows for increasing the bonding strength between the adhesive member 53 and the light-emitting device 1. On the second surface 30d (mounting surface) of the light-emitting device 1, the adhesive member 53 may be in contact only with the light-reflective member 21.

In the description below, components in a method of manufacturing the light-emitting device 1, the light-emitting device 1, and the light source device 50 according to certain embodiments of the present invention will be described.

Light-Emitting Element 10

Examples of the light-emitting element 10 include an LED chip. The light-emitting element 10 can have, for example, a semiconductor layered structure containing a nitride semiconductor ($In_xAl_yGa_{1-x-y}N$, where 0≤x, 0≤y, and x+y≤1), which is configured to emit ultraviolet to visible light. The emission peak wavelength of the light-emitting element 10 is preferably in a range of 400 nm to 530 nm, more preferably 420 nm to 490 nm, further preferably 450 nm to 475 nm, in consideration of the luminous efficacy of the light-emitting device, the excitation spectrum of the phosphor, and the color mixing performance.

The light-emitting device 1 may include a single light-emitting element 10 or two or more light-emitting elements 10. In the case of including a plurality of light-emitting elements 10, the light-emitting elements can be, for example, a plurality of blue light-emitting elements configured to emit blue light, three light-emitting elements configured to emit blue light, green light, and red light, or a combination of at least one light-emitting element configured to emit blue light and at least one light-emitting element configured to emit green light. In the case in which the light-emitting device 1 is used for a light source for a liquid-crystal display device or the like, one light-emitting element configured to emit blue light, two light-emitting elements configured to emit blue light, three or more light-emitting elements configured to emit blue light, or a combination of at least one light-emitting element configured to emit blue light and at least one light-emitting element configured to emit green light is preferably used for the at least one light-emitting element 10. Both of the light-emitting element that emits blue light and the light-emitting element that emits green light are preferably light-emitting elements with half-bandwidths of 40 nm or less, more preferably light-emitting elements with half-bandwidths of 30 nm or less. Using such light emitting elements allows for easily obtaining sharp emission peaks of blue light and green light. Accordingly, for example, in the case in which the light-emitting device is used for a light source for a liquid-crystal display, the liquid-crystal display can achieve good color reproducibility. The light-emitting elements can be electrically connected in series or in parallel, or in combination of series connections and parallel connections.

The light-emitting element 10 may have any appropriate shape in a plan view, and may have a square shape or an elongated rectangular shape in a plan view. The light-emitting element 10 may have a hexagonal shape or another polygonal shape in a plan view. The light-emitting element 10 includes a pair of positive and negative electrodes. The positive and negative electrodes can be made of gold, silver, copper, tin, platinum, rhodium, titanium, aluminum, tungsten, palladium, nickel, or an alloy of two or more of these metals. The lateral surfaces of the light-emitting element 10 may be perpendicular to the upper surface of the light-emitting element 10 or may be inclined inward or outward.

Light-Transmissive Member 16

The light-transmissive member 16 is disposed on the light-emitting element 10 and protects the light-emitting element 10. The light-transmissive member 16 may be made of a single layer or a plurality of layers. In the case in which the light-transmissive member 16 includes a plurality of layers, the base materials of the layers may be the same or different.

A material that transmits light emitted from the light-emitting element 10 is used for the base material of the light-transmissive member 16. In the present specification, the term "transmit" indicates that the light transmittance at the emission peak wavelength of the light-emitting element 10 is 60% or more, preferably 70% or more, more preferably 80% or more. Examples of the base material of the light-transmissive member 16 include silicone resins, epoxy resins, phenolic resins, polycarbonate resins, acrylic resins, and modified resins of these resins. The base material of the light-transmissive member 16 may be glass. A silicone resin or an epoxy resin, which has good resistance to heat and light, is particularly preferable. Examples of the silicone resin include dimethyl silicone resins, phenyl-methyl silicone resins, and diphenyl silicone resins. The "modified resins" in the present specification include hybrid resins.

The light-transmissive member 16 may contain light-diffusing particles. Examples of the light-diffusing particles include silicon oxide, aluminum oxide, zirconium oxide, and zinc oxide. One of these light-diffusing particles can be used singly, or two or more of these light-diffusing particles can be used in combination. Silicon oxide, which has a small linear expansion coefficient, is particularly preferably used for the light-diffusing particles. Nanoparticles are preferably used for the light-diffusing particles. Scattering of light emitted from the light-emitting element is thus increased, so that the amount of the phosphor to be used can be reduced. The term "nanoparticles" as used herein refers to particles having particle diameters in a range of 1 nm to 100 nm. The particle diameter in the present specification is mainly defined as D50.

The light-transmissive member 16 may contain a phosphor. The phosphor absorbs at least a portion of primary light emitted from the light-emitting element 10 and emits secondary light having a wavelength different from a wavelength of the primary light. For the phosphor, one of the phosphors described below can be used singly, or two or more of the phosphors described below can be used in combination.

Examples of the phosphor include yttrium-aluminum-garnet based phosphors (for example, $Y_3(Al,Ga)_5O_{12}$:Ce), lutetium-aluminum-garnet based phosphors (for example, $Lu_3(Al,Ga)_5O_{12}$:Ce), terbium-aluminum-garnet based phosphors (for example, $Tb_3(Al,Ga)_5O_{12}$:Ce), silicate based phosphors (for example, $(Ba,Sr)_2SiO_4$:Eu), chlorosilicate based phosphors (for example, $CaMg(SiO_4)_4Cl_2$:Eu), β-SiAlON based phosphors (for example, $Si_{6-z}Al_zO_zN_{8-z}$:Eu (0<z<4.2)), SGS based phosphors (for example, $SrGa_2S_4$:Eu), alkaline earth aluminate based phosphors (for example, $(Ba,Sr,Ca)Mg_xAl_{10}O_{17-x}$:Eu,Mn), α-SiAlON based phosphors (for example, $M_z(Si,Al)_{12}(O,N)_{16}$ (where 0<z≤2, and M is Li, Mg, Ca, Y, or a lanthanoid element except for La and Ce), nitrogen-containing calcium aluminosilicate based phosphors (for example, $(Sr,Ca)AlSiN_3$:Eu), and manganese-activated fluoride based phosphors (phosphors represented by the general formula (I) $A_2[M_{1-a}Mn_aF_6]$, where "A" is at least one selected from the group consisting of K, Li, Na, Rb, Cs, and $NH_4$, M is at least one element selected from the group consisting of group IV elements and group XIV elements, and "a" satisfies 0<a<0.2). The peak emission wavelength of an yttrium-aluminum-garnet based phosphor can be shifted to a longer wavelength by substituting a portion of Y with Gd. Typical examples of the manganese-activated fluoride based phosphors include manganese-activated potassium fluorosilicate phosphors (for example, $K_2SiF_6$:Mn).

A sintered body of a phosphor and an inorganic material such as alumina, or a plate-shaped crystal of the phosphor may be used for the light-transmissive member 16.

The light-transmissive member 16 can include the phosphor layer 14 containing the phosphor and the light-transmissive layer 15 containing substantially no phosphor. With the light-transmissive layer 15 disposed on the upper surface of the phosphor layer 14, the light-transmissive layer 15 functions as a protective layer and allows for reducing deterioration of the phosphor inside the phosphor layer 14. The expression that the layer "contains substantially no phosphor" encompasses a case in which a phosphor is unavoidably mixed in the light transmissive layer 15.

Light-Reflective Member 21

The light reflectance of the light-reflective member 21 at the peak emission wavelength of the light-emitting element 10 is preferably 70% or more, more preferably 80% or more, further preferably 90% or more, in view of the light extraction efficiency in the direction toward the upper surface of the light-emitting device 1. In addition, the light-reflective member 21 is preferably white. The light-reflective member 21 can contain a light-reflective substance mixed in the resin material serving as the base material. The light-reflective member 21 can be obtained by solidifying a liquid resin material. The light-reflective member 21 can be formed by using, for example, transfer molding, injection molding, compression molding, or potting.

The light-reflective member 21 may contain a resin material as the base material. A thermosetting resin or a thermoplastic resin can be used as the resin material to serve as the base material. Specific examples of the resin material include epoxy resins, silicone resins, modified epoxy resins such as silicone-modified epoxy resins, modified silicone resins such as epoxy-modified silicone resins, unsaturated polyester resins, saturated polyester resins, polyimide resins, modified polyimide resins, polyphthalamide (PPA), polycarbonate resins, poly(phenylene sulfide) (PPS), liquid crystal polymers (LCPs), ABS resins, phenolic resins, acrylic resins, and PBT resins. In particular, a thermosetting resin, such as epoxy resins and silicone resins, which have good resistance to heat and light, is preferably used as the resin material for the light-reflective member 21.

It is preferable that the light-reflective member 21 contain a light-reflective substance in the resin material serving as the base material. For the light-reflective substance, a material that is unlikely to absorb light emitted from the light-emitting element and having a reflective index greatly different from a refractive index of the resin material serving as the base material is preferably used. Examples of such a light-reflective substance include titanium oxide, zinc oxide, silicon oxide, zirconium oxide, aluminum oxide, and aluminum nitride.

Adhesive Layer 13 and Light Guide Member 13

The light guide member 13 covers lateral surfaces of the light-emitting element 10 and guides light emitted from the lateral surfaces of the light-emitting element 10 toward the upper surface of the light-emitting device. In other words, a portion of light that has reached a lateral surface of the light-emitting element 10 is otherwise reflected by the lateral surface and attenuated inside the light-emitting element 10, but the light guide member 13 can guide the light into the light guide member 13, so that the light can be extracted out of the light-emitting element 10. A resin material described above in examples of a material for the light-reflective member 21 can be used for the adhesive layer 13 and the light guide member 13. A light-transmissive thermosetting resin such as silicone resins, modified silicone resins, epoxy resins, and phenolic resins is particularly preferably used for the adhesive layer 13 and the light guide member 13. The adhesive layer 13 and the light guide member 13 preferably have a high light transmittance. Accordingly, it is generally preferable that the adhesive layer 13 and the light guide member 13 contain substantially no additive that reflects, absorbs, or scatters light. The expression that "contain substantially no additive" encompasses a case in which an additive is unavoidably mixed in the adhesive layer 13 or the light guide member 13. The adhesive layer 13 and the light guide member 13 may contain substantially the same light-diffusing particles and/or phosphor as those in the light-transmissive member 16 described above.

An epoxy resin can be selected as the resin material serving as the base material of the light-reflective member 21, the light guide member 13, and the light-transmissive member 16. Selecting an epoxy resin, which has a higher strength than a silicone resin in a solid state, allows for increasing the strength of the light-emitting device 1. Selecting the same resin material as the base materials of the members allows for increasing the adhesion strength between the members. In the case in which an epoxy resin is selected for the adhesive member 53, the bonding strength between the adhesive member 53 and the light-reflective member 21 or other components can be enhanced.

Mounting Board 51

The mounting board 51 includes a plate-shaped base member made of a glass epoxy resin, a ceramic, a polyimide, or the like. The mounting board 51 also includes land parts and a wiring pattern made of copper, gold, silver, nickel, palladium, tungsten, chromium, titanium, an alloy of these metals, or the like on the base member. The land parts and the wiring pattern are formed by, for example, plating, lamination compression bonding, applying, sputtering, vacuum evaporation, or etching.

Bonding Members 52

The bonding members 52 can be made of any material known in the field of the invention. Specific examples of the material of the bonding members 52 include solders such as tin-bismuth based solders, tin-copper based solders, tin-silver based solders, and gold-tin based solders (specifically, an alloy whose main components are Ag, Cu, and Sn, an alloy whose main components are Cu and Sn, and an alloy whose main components are Bi and Sn); eutectic alloys (such as an alloy whose main components are Au and Sn, an alloy whose main components are Au and Si, and an alloy whose main components are Au and Ge); electrically-conductive pastes of silver, gold, and palladium; bumps; anisotropic conductive materials; and brazing materials of low-melting-point metals.

Adhesive Member 53

For the adhesive member 53, for example, a resin material such as an epoxy resin described above in examples of a material of the light-transmissive member 16, or a material described above in examples of a material of the bonding members 52. The bonding members 52 and the adhesive member 53 may be made of the same material or different materials. In the case in which the bonding members 52 and the adhesive member 53 are made of different material, solder, which is an electrically-conductive material, can be selected for the bonding members 52, and a resin material such as an epoxy resin can be selected for the adhesive member 53.

Subsequently, the effects of the present embodiment will be described.

In the present embodiment, the first grooves 106 are formed on the first surface 23a of the intermediate structure 23 in the step shown in FIG. 9A and FIG. 9B; the electrically conductive film 25 is formed on the first surface 23a and the inner surfaces defining the first grooves 106 in the step shown in FIG. 10A and FIG. 10B; the electrically conductive film 25 covering the inter-electrode regions 107 is removed; the holes 109 are formed such that each of the holes 109 divides a reflective one of the first grooves 106, causing separation of each of the electrically conductive films 25 into a portion connected to the electrode 12a and a portion connected to the electrode 12b in the step shown in FIG. 11A and FIG. 11B; and the light-reflective member 21 and the electrically conductive films 25 are cut along the first grooves 106 by forming the grooves 110 in the step shown in FIG. 12A and FIG. 12B. Accordingly, the electrically conductive films 25 formed on the inner surfaces defining the first grooves 106 constitute external electrodes formed on a surface meeting the light extraction surface. In this manner, the light-emitting device 1 in which the electrodes are disposed on the second surface 30d intersecting with the light extraction surface 30a can be efficiently manufactured.

In the present embodiment, the grooves 105a and 105b narrower than the first grooves 106 and than the third grooves 110 are formed in the step shown in FIG. 6A and FIG. 6B. Accordingly, the layered bodies 20 can be disposed closer to each other in the intermediate structure 23. This allows for increasing productivity of the light-emitting devices 1.

In addition, in the present embodiment, the first metal layer portions 101a and 101b are disposed on the substrate 100, and the intermediate structure 23 is formed starting from the first metal layer portion 101a and the second metal layer portion 101b in the steps shown in FIG. 1A to FIG. 5B. The intermediate structure 23 can thus be easily and precisely produced. By removing the substrate 100 in the step shown in FIG. 8A and FIG. 8B, the electrodes 12a and 12b can be exposed on the first surface 23a of the intermediate structure 23.

Further, with the recognition targets 102 having formed on the substrate 100, the grooves 105a, 105b, and 105c can be precisely formed by forming the grooves 105a, 105b, and 105c with reference to the recognition targets 102 in the step shown in FIG. 6A and FIG. 6B.

In the light-emitting device 1 according to the present embodiment, the second electrically conductive films 25B are disposed on the second surface 30d meeting the light extraction surface 30a. Accordingly, when the light-emitting device 1 is mounted on the mounting board 51 via the second electrically conductive films 25B used as the electrodes for mounting, the light extraction surface 30a meets the upper surface 51a of the mounting board 51. With this structure, the side-view light source device 50 in which the direction of emission of light L is substantially parallel to the upper surface 51a of the mounting board 51 can be obtained.

In addition, in the light-emitting device 1 according to the present embodiment, the first region 30d1 (electrode side region) of the second surface 30d (mounting surface) is recessed inward relative to the second region 30d2 (light-extraction side region). Accordingly, the bonding members 52 can be easily disposed between the mounting board 51 and the first region 30d1 (electrode side region) when the light-emitting device 1 is mounted on the mounting board 51. This allows for stabilizing the orientation of the light-emitting device 1 relative to the mounting board 51.

It is also possible to fill electrically-conductive paste into the first grooves 106, solidify the electrically-conductive paste, form, for example, bottomed grooves in a portion of the solidified electrically-conductive paste, and form the electrically conductive film 25 by sputtering or the like. This allows for increasing the strength of the electrically conductive film 25, so that breakage of the electrically conductive film 25 can be inhibited.

First Modified Example

A first modified example will next be described.

Figure 15A:
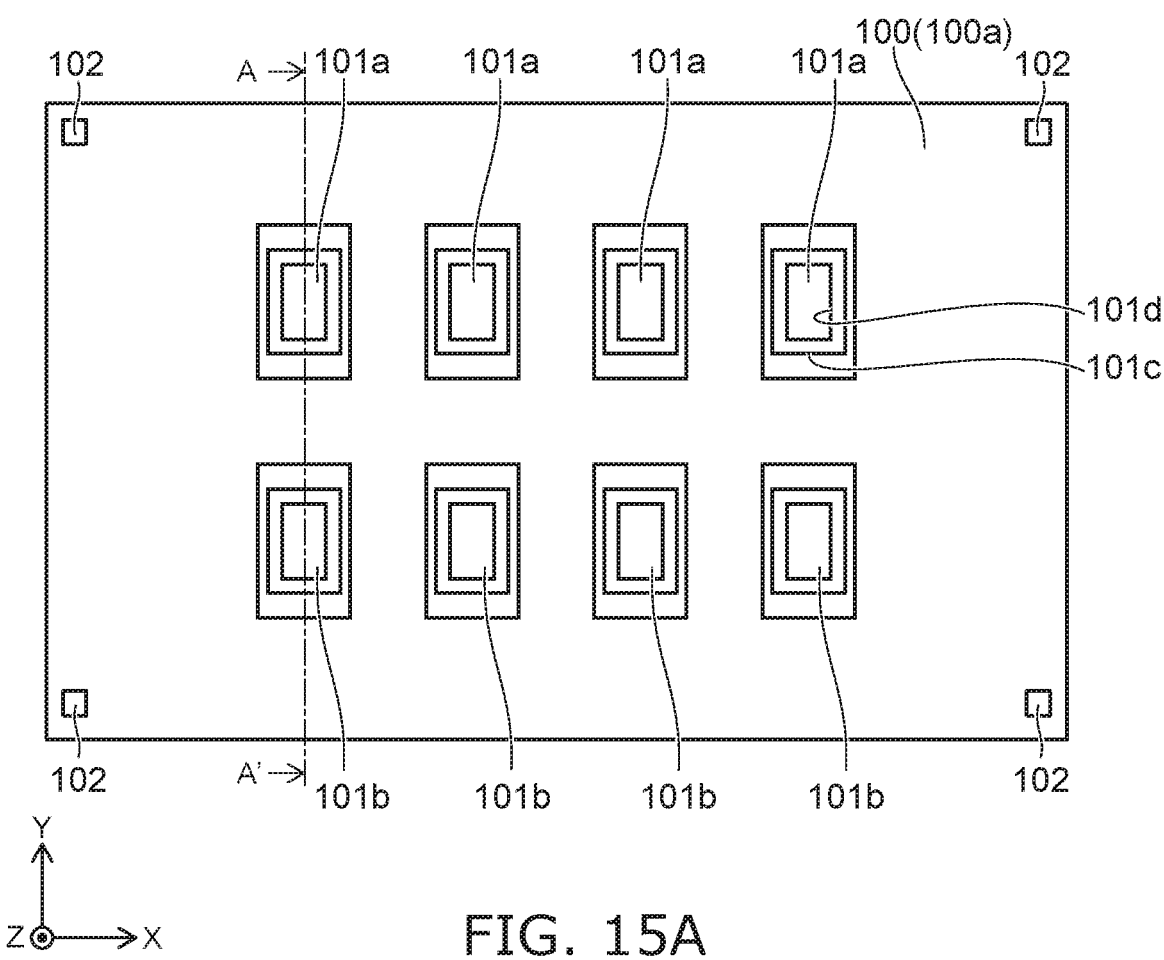
FIG. 15A is a schematic plan view for illustrating a method of manufacturing a light-emitting device according to a modification.
Figure 15B:
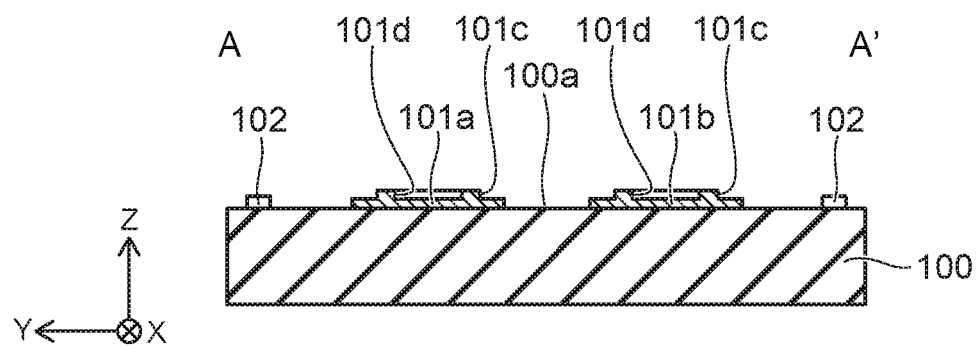
FIG. 15B is a schematic cross-sectional view taken along the line A-A' of FIG. 15A.

FIG. 15A is a schematic plan view for illustrating a method of manufacturing a light-emitting device according to the present modification. FIG. 15B is a schematic cross-sectional view taken along the line A-A' of FIG. 15A.

A step shown in FIG. 15A and FIG. 15B corresponds to the step shown in FIG. 1A and FIG. 1B in the first embodiment described above.

As shown in FIG. 15A and FIG. 15B, a recessed portion 101d is formed on the upper surface of each of the projections 101c of the first metal layer portions 101a and 101b of the substrate 100 in the present modified example. With this structure, even when an excessive amount of the bonding member 103 is applied to each of the projections 101c of the first metal layer portions 101a and 101b, the surplus portion of bonding member 103 can be accommodated in the recessed portion 101d. Accordingly, for example, the amount of the bonding members 103 located around the electrodes 12a and 12b of the light-emitting element 10 can be reduced, and the amount of the bonding member 53 exposed after removing the substrate 100 can be reduced. This allows for facilitating the step of selectively removing the electrically conductive film 25 by using laser ablation or the like. Steps in the method of manufacturing, the structure, and the effects in the present modified example other than those described above in the present modified example are similar to those in the first embodiment described above.

Second Modified Example

A second modified example will next be described.

Figure 16A:
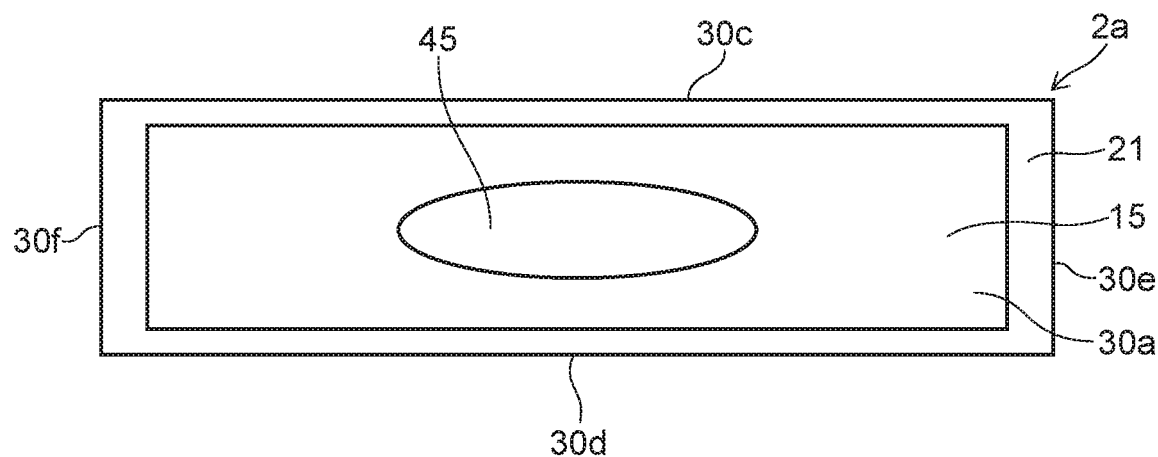
FIG. 16A is a schematic front view of an illustrative light-emitting device according to a second modified example.
Figure 16B:
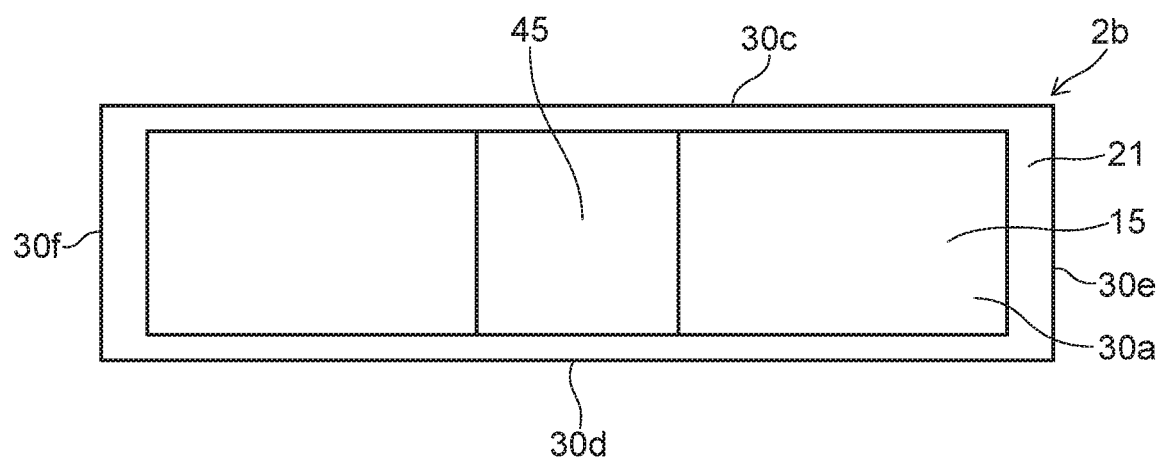
FIG. 16B is a schematic front view of another illustrative light-emitting device according to the second modified example.

FIG. 16A is a schematic front view of an illustrative light-emitting device according to the present modification. FIG. 16B is a schematic front view of another illustrative light-emitting device according to the present modification.

As shown in FIG. 16A and FIG. 16B, a reflective material 45 containing a light-reflective substance is disposed on the light extraction surface 30a of a light-emitting device 2a according to the present modification. For example, the reflective material 45 is disposed on the light extraction surface 30a directly above the light-emitting element 10. Disposing the reflective material 45 containing a light-reflective substance directly above the light-emitting element 10 where the light output is maximum allows for reducing the light output directly above the light-emitting element 10, so that an overall light output from the light extraction surface 30a of the light-emitting device 1 can be easily uniform. The content of the light-reflective substance in the whole reflective material 45 is, for example, in a range of 5 wt % to 75 wt %, preferably 8 wt % to 65 wt %. The light-emitting device 2a may include only one layer of the reflective material 45 or a plurality of layers of reflective material 45 on the light extraction surface 30a.

The reflective material 45 may be disposed in a region spaced apart from the edges of the light-transmissive layer 15 as shown in FIG. 16A. In this case, the reflective material 45 has a shape in a plan view is preferably elongated in a longitudinal direction when the light extraction surface 30a of the light-emitting device 2a has long sides and short sides. With this structure, the overall light output from the light extraction surface 30a of the light-emitting device 2a can be easily uniform. Alternatively, the reflective material 45 may be disposed in a region in contact with edges of the light-transmissive layer 15 as shown in FIG. 16B. For example, the shape of the reflective material 45 in a plan view may overlap with a pair of opposite sides of the light extraction surface 30a. This structure allows for further increasing the light output in the longitudinal direction relative to the light output in the width direction of the light extraction surface 30a. The reflective material 45 in a plan view can have various shapes besides the above-described shapes.

Embodiments of the present invention can be used for, for example, a light source of a display device.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A method of manufacturing a light-emitting device, the method comprising:
provRoundRectingle an intermediate structure having a first surface and a second surface opposite to the first surface, the intermediate structure comprising:
a plurality of layered bodies aligned in a first direction in a light-reflective member, each of the layered bodies comprising:
a pair of electrodes aligned in a second direction intersecting with the first direction, each pair of electrodes being exposed from the light-reflective member at the first surface,
a semiconductor layered body connected to the pair of electrodes, and
a light-transmissive member,
wherein at least one second-surface groove is formed at the second surface in the light-reflective member between two adjacent layered bodies of the plurality of layered bodies;
forming at least one first-surface groove at the first surface in the light-reflective member, the first-surface groove extending in the second direction at a location between the two adjacent layered bodies;
forming at least one electrically conductive film, each disposed on the first surface and inside a respective one of the at least one first-surface groove, wherein a width of each of the at least one first-surface groove is greater than a width of each of the at least one second-surface groove;
exposing a portion of the light-reflective member in an inter-electrode region between the pair of electrodes on the first surface by removing a corresponding portion of the electrically conductive film covering the inter-electrode region;
forming a hole having a width equal to or greater than a width of the at least one first-surface groove and having a depth equal to or greater than a depth of the at least one first-surface groove, so as to remove a portion of each of the at least one electrically conductive film inside a respective one of the at least one first-surface groove at a location between two inter-electrode regions adjacent to each other across the respective one of the at least one first-surface groove; and
cutting the light-reflective member and the at least one electrically conductive film along the at least one first-surface groove to obtain a plurality of light-emitting devices.

2. The method of manufacturing a light-emitting device according to claim 1, wherein each of the at least one first-surface groove faces a respective one of the at least one second-surface groove.

3. The method of manufacturing a light-emitting device according to claim 1,
wherein the at least one second-surface groove comprises a plurality of second-surface grooves; and
wherein each of the at least one first-surface groove is formed at a position facing alternate ones of the plurality of second-surface grooves.

4. The method of manufacturing a light-emitting device according to claim 1,
wherein the first surface of the intermediate structure faces an upper surface of a substrate;
wherein a recognition target is formed in a region of the upper surface of the substrate not covered with the light-reflective member;
wherein the at least one second-surface groove is formed with reference to the recognition target; and
wherein the method further comprises, between the step of providing the intermediate structure and the step of forming the at least one first-surface groove, exposing the pair of electrodes by removing the substrate.

5. The method of manufacturing a light-emitting device according to claim 1, wherein the step of providing an intermediate structure further comprises exposing the light-transmissive member by removing the second surface of the intermediate structure.

* * * * *